United States Patent
Wang et al.

(10) Patent No.: US 12,037,682 B2
(45) Date of Patent: Jul. 16, 2024

(54) METHODS FOR FORMING LOW RESISTIVITY TUNGSTEN FEATURES

(71) Applicant: Applied Materials, Inc., Santa Clara, CA (US)

(72) Inventors: Peiqi Wang, Campbell, CA (US); Cheng Cheng, San Jose, CA (US); Kai Wu, Palo Alto, CA (US); Insu Ha, San Jose, CA (US); Sang Jin Lee, Seoul (KR)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 17/814,653

(22) Filed: Jul. 25, 2022

(65) Prior Publication Data
US 2023/0107536 A1    Apr. 6, 2023

Related U.S. Application Data

(60) Provisional application No. 63/363,646, filed on Apr. 27, 2022, provisional application No. 63/252,478, filed on Oct. 5, 2021.

(51) Int. Cl.
*C23C 16/06* (2006.01)
*C23C 16/04* (2006.01)
(Continued)

(52) U.S. Cl.
CPC .......... *C23C 16/38* (2013.01); *C23C 16/042* (2013.01); *C23C 16/45553* (2013.01); *C23C 16/56* (2013.01)

(58) Field of Classification Search
CPC ........ C23C 16/06; C23C 16/14; C23C 16/08; C23C 16/45553
See application file for complete search history.

(56) References Cited

U.S. PATENT DOCUMENTS 6,399,484 B1 *   6/2002   Yamasaki .......... H01L 21/28568
                                                          438/653
6,905,543 B1 *   6/2005   Fair ..................... C23C 16/0218
                                                          427/253

(Continued)

FOREIGN PATENT DOCUMENTS

WO    2020112487 A1    6/2020
WO    2020112616 A1    6/2020

(Continued)

OTHER PUBLICATIONS

Kim, Soo-Hyun, et al., "Atomic Layer Deposition of Low-Resistivity and High-Density Tungsten Nitride Thin Films Using B2H6, WF6, and NH3". Electrochemical and Solid-State Letters, 9 (3) C54-C57 (2006).*

(Continued)

*Primary Examiner* — Bret P Chen
(74) *Attorney, Agent, or Firm* — Patterson + Sheridan, LLP

(57) ABSTRACT

A method of forming a structure of a substrate is provided including a tungsten-containing layer including a nucleation layer and a fill layer. The method includes disposing a nucleation layer along sidewalls of the opening, wherein nucleation layer includes boron and tungsten. Disposing the fill layer over the nucleation layer within the opening, wherein a tungsten-containing layer includes a resistivity of about 16 μΩ·cm or less, wherein a tungsten-containing layer has a thickness of about 200 Å to about 600 Å, and wherein a tungsten-containing layer thickness is half a width of the tungsten-containing layer disposed within the opening between opposing sidewall portions of the opening.

20 Claims, 10 Drawing Sheets

(51) Int. Cl.
 *C23C 16/38* (2006.01)
 *C23C 16/455* (2006.01)
 *C23C 16/56* (2006.01)

(56) References Cited

U.S. PATENT DOCUMENTS

| | | | |
|---|---|---|---|
| 6,939,804 | B2 | 9/2005 | Lai et al. |
| 7,863,190 | B1 | 1/2011 | Papasouliotis et al. |
| 7,964,505 | B2* | 6/2011 | Khandelwal ...... H01L 21/76855 |
| | | | 257/E21.585 |
| 8,119,527 | B1 | 2/2012 | Chadrashekar et al. |
| 8,124,531 | B2 | 2/2012 | Chandrashekar et al. |
| 8,207,062 | B2* | 6/2012 | Gao ................. H01L 21/76843 |
| | | | 427/537 |
| 8,435,894 | B2 | 5/2013 | Chandrashekar et al. |
| 8,709,948 | B2* | 4/2014 | Danek .............. H01L 21/76898 |
| | | | 438/678 |
| 8,835,317 | B2 | 9/2014 | Chandrashekar et al. |
| 9,034,768 | B2 | 5/2015 | Chandrashekar et al. |
| 9,169,556 | B2 | 10/2015 | Wu et al. |
| 9,240,347 | B2 | 1/2016 | Chandrashekar et al. |
| 9,330,939 | B2 | 5/2016 | Zope et al. |
| 9,349,637 | B2 | 5/2016 | Na et al. |
| 9,425,078 | B2 | 8/2016 | Tang et al. |
| 9,548,228 | B2 | 1/2017 | Chandrashekar et al. |
| 9,564,312 | B2 | 2/2017 | Henri et al. |
| 9,653,352 | B2 | 5/2017 | Wu et al. |
| 9,653,353 | B2 | 5/2017 | Chandrashekar et al. |
| 9,685,371 | B2 | 6/2017 | Zope et al. |
| 9,837,312 | B1 | 12/2017 | Tan et al. |
| 9,997,405 | B2 | 6/2018 | Chandrashekar et al. |
| 10,103,058 | B2 | 10/2018 | Chandrashekar et al. |
| 10,157,787 | B2 | 12/2018 | Park et al. |
| 10,170,320 | B2 | 1/2019 | Wang et al. |
| 10,211,099 | B2 | 2/2019 | Wang et al. |
| 10,242,879 | B2 | 3/2019 | Na et al. |
| 10,256,114 | B2 | 4/2019 | Huemoeller et al. |
| 10,256,142 | B2 | 4/2019 | Chandrashekar et al. |
| 10,381,266 | B2 | 8/2019 | Yang et al. |
| 10,438,847 | B2 | 10/2019 | Lai et al. |
| 10,559,461 | B2 | 2/2020 | Reddy et al. |
| 10,566,211 | B2 | 2/2020 | Chandrashekar et al. |
| 10,573,522 | B2 | 2/2020 | Jandl et al. |
| 10,580,695 | B2 | 3/2020 | Chandrashekar et al. |
| 10,600,685 | B2 | 3/2020 | Yao et al. |
| 10,643,889 | B2 | 5/2020 | Hausmann et al. |
| 10,662,526 | B2 | 5/2020 | Hausmann et al. |
| 10,727,046 | B2 | 7/2020 | Abel et al. |
| 2006/0264031 | A1* | 11/2006 | Xi ...................... C23C 16/0272 |
| | | | 257/E21.171 |
| 2008/0003797 | A1* | 1/2008 | Kim .................. H01L 21/28556 |
| | | | 438/597 |
| 2008/0124926 | A1 | 5/2008 | Chan et al. |
| 2009/0149022 | A1 | 6/2009 | Chan et al. |
| 2010/0244260 | A1* | 9/2010 | Hinomura ......... H01L 21/76846 |
| | | | 438/643 |
| 2011/0223763 | A1* | 9/2011 | Chan ................. C23C 16/45525 |
| | | | 438/654 |
| 2012/0015518 | A1 | 1/2012 | Chandrashekar et al. |
| 2014/0061784 | A1* | 3/2014 | Kang ................. H01L 29/4966 |
| | | | 257/334 |
| 2015/0179461 | A1* | 6/2015 | Bamnolker ....... H01L 21/28556 |
| | | | 118/697 |
| 2016/0190008 | A1 | 6/2016 | Chandrashekar et al. |
| 2016/0351444 | A1 | 12/2016 | Schloss et al. |
| 2017/0365513 | A1 | 12/2017 | Yang et al. |
| 2018/0053660 | A1* | 2/2018 | Jandl ...................... C23C 16/14 |
| 2019/0019725 | A1 | 1/2019 | Chandrashekar et al. |
| 2019/0206731 | A1 | 7/2019 | Chandrashekar et al. |
| 2019/0326168 | A1 | 10/2019 | Yang et al. |
| 2020/0017967 | A1 | 1/2020 | Abel et al. |
| 2020/0041407 | A1* | 2/2020 | Huang ............... C23C 16/45512 |
| 2020/0144066 | A1 | 5/2020 | Jandl et al. |
| 2020/0185273 | A1 | 6/2020 | Chandrashekar et al. |
| 2020/0242209 | A1 | 7/2020 | Bowes et al. |

FOREIGN PATENT DOCUMENTS

| | | | |
|---|---|---|---|
| WO | 2020118100 | A1 | 6/2020 |
| WO | 2020168071 | A1 | 8/2020 |

OTHER PUBLICATIONS

Smith, Steven, et al., "Low resistivity tungsten for contact metallization". Microelectronic Engineering 82 (2005) 261-265.*

Yang, Mengdi, et al., "Low-resistivity α-phase tungsten films grown by hot-wire assisted atomic layer deposition in high-aspect-ratio structures". Thin Solid Films 646 (2018) 199-208.*

Kim, Soo-Hyun, et al., "A Comparative Study of the Atomic-Layer-Deposited Tungsten Thin Films as Nucleation Layers for W-Plug Deposition". Journal of The Electrochemical Society, 153 (10) G887-G893 (2006).*

Kim, Choon-Hwan, et al., "Pulsed CVD-W Nucleation Layer Using WF6 and B2H6 for Low Resistivity W". Journal of The Electrochemical Society, 156 (9) H685-H689 (2009).*

Chandrashekar, Anand, et al., "Tungsten Contact and Line Resistance Reduction with Advanced Pulsed Nucleation Layer and Low Resistivity Tungsten Treatment". Japanese Journal of Applied Physics 49 (2010) 096501, pp. 1-4.*

International Search Report and Written Opinion for International Application No. PCT/US2022/038211 dated Nov. 14, 2022.

* cited by examiner

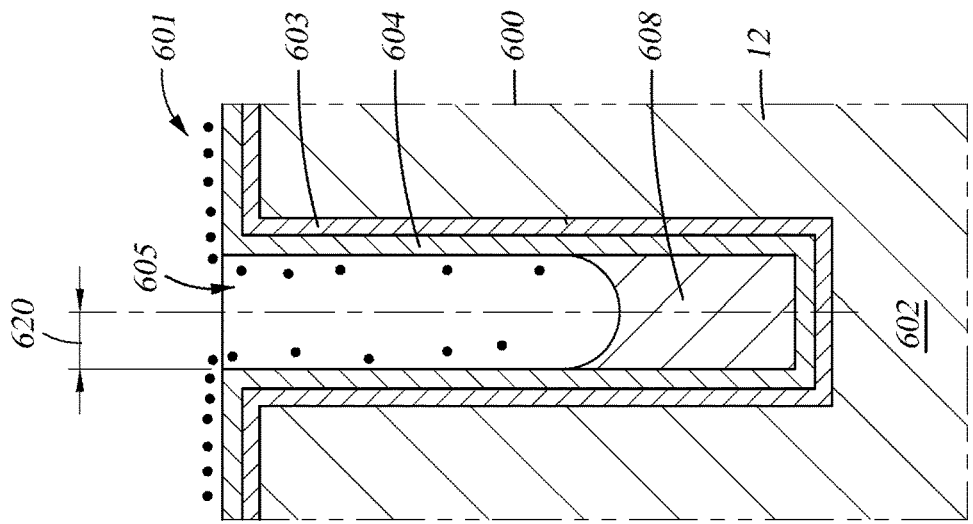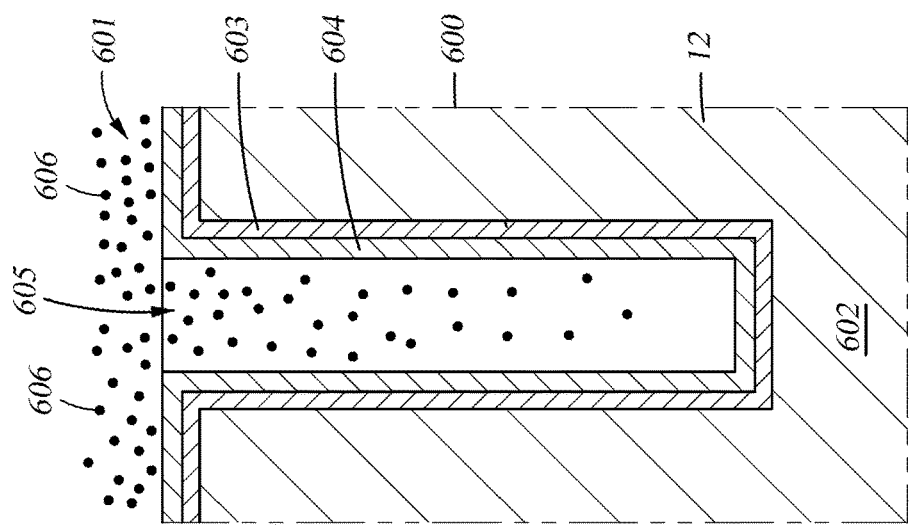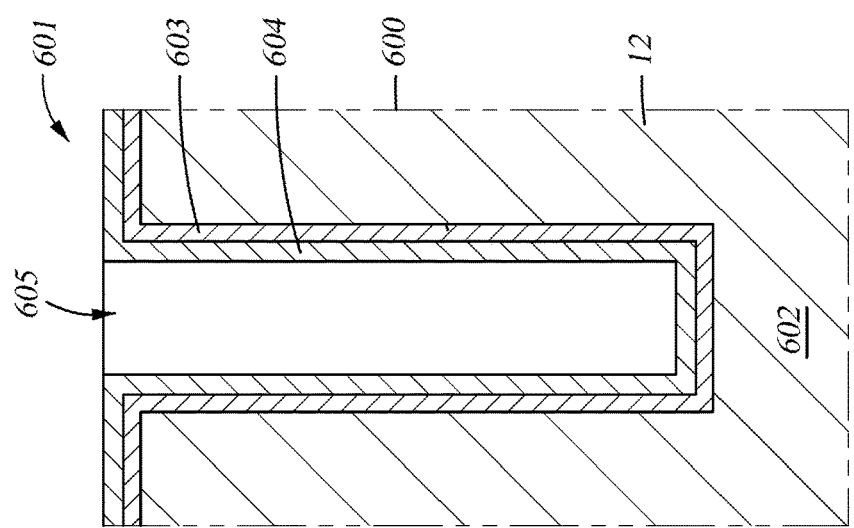

METHODS FOR FORMING LOW RESISTIVITY TUNGSTEN FEATURES

CROSS-REFERENCE TO RELATED APPLICATIONS

This Application claims the benefit of U.S. Provisional Application 63/363,646, filed on Apr. 27, 2022 and U.S. Provisional Application 63/252,478, filed on Oct. 5, 2021, each of which are incorporated herein in its entirety.

BACKGROUND

Field

Embodiments herein are directed to methods used in electronic device manufacturing, and more particularly, to methods used for forming tungsten features in a semiconductor device.

Description of the Related Art

Tungsten (W) is widely used in integrated circuit (IC) device manufacturing to form conductive features where relatively low electrical resistance and relativity high resistance to electromigration are desired. For example, tungsten may be used as a metal fill material to form source contacts, drain contacts, metal gate fill, gate contacts, interconnects (e.g., horizontal features formed in a surface of a dielectric material layer), and vias (e.g., vertical features formed through a dielectric material layer to connect other interconnect features disposed there above and there below). Due to its relativity low resistivity, tungsten is also commonly used to form bit lines and word lines used to address individual memory cells in a memory cell array of a dynamic random-access memory (DRAM) device.

As circuit densities increase and device features continue to shrink to meet the demands of the next generation of semiconductor devices, reliably producing tungsten features has become increasingly challenging. Issues such as voids and seams formed during a conventional tungsten deposition process become amplified with decreasing feature size and can detrimentally affect the performance and reliability of a device or even render a device inoperable.

Accordingly, there is a need for processes to fill contact features that are free or substantially free of voids and seams and have low resistivity for various film thicknesses.

SUMMARY

A structure is provided including a tungsten-containing layer including a nucleation layer and a fill layer. The nucleation layer is disposed along sidewalls of the opening. The nucleation layer includes boron and tungsten. The fill layer is disposed over the nucleation layer within the opening. The tungsten-containing layer includes a resistivity of about 16 μΩ·cm or less. The tungsten-containing layer has a thickness of about 200 Å to about 600 Å. The tungsten-containing layer thickness is half a width of the tungsten-containing layer disposed within the opening between opposing sidewall portions of the opening.

A structure on a substrate is provided including an opening within the substrate. An adhesion layer is disposed on a sidewall of the opening and a tungsten-containing layer is disposed over the adhesion layer within the sidewall. The tungsten-containing layer has a resistivity of about 16 μΩ·cm or less and the tungsten-containing layer has a thickness of about 200 Å to about 600 Å. The tungsten-containing layer thickness is half a width of the tungsten-containing layer disposed within the opening between opposing sidewall portions of the opening.

A method of forming a structure is provided. The method includes exposing a substrate to a tungsten-containing precursor gas at a precursor gas flow rate. The substrate is exposed to a reducing agent comprising boron at a reducing agent flow rate. The tungsten-containing precursor gas and the reducing agent are alternated cyclically to form a nucleation layer over the substrate within at least one opening of the substrate. The method includes depositing a fill layer over the nucleation layer within the at least one opening. The substrate is annealed at about 600° C. to about 1000° C.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 6A a schematic cross-sectional side view of a substrate prior to treatment, according to one embodiment.

FIG. 6B a schematic cross-sectional side view of a substrate at a stage of treatment, according to one embodiment.

FIG. 6C a schematic cross-sectional side view of a substrate at a stage of treatment, according to one embodiment.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments herein are generally directed electronic device manufacturing and, more particularly, to systems and methods for forming low resistivity tungsten features in a semiconductor device manufacturing scheme.

Figure 1A:
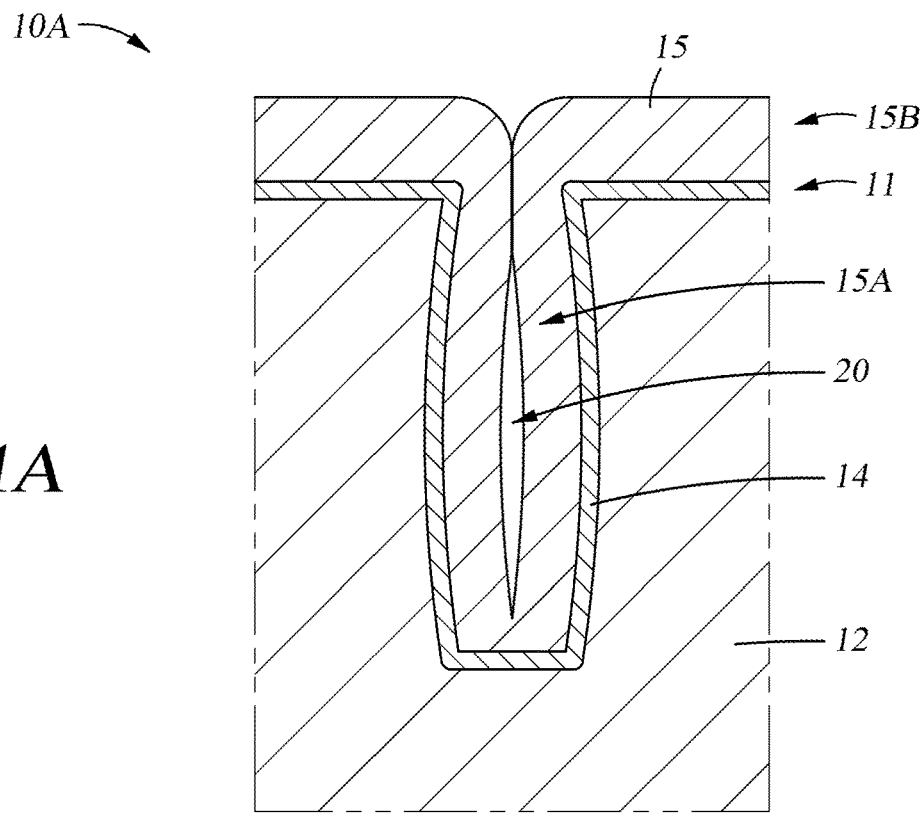
FIGS. 1A-1B are schematic sectional views of a portion of a substrate illustrating undesirable voiding or seaming in conventionally formed tungsten features.

FIG. 1A is a schematic cross-sectional view of a substrate 10A illustrating an undesirable void 20 formed during a conventional tungsten deposition process. Here, the substrate 10A includes a patterned surface 11 comprising a dielectric layer 12 having a high aspect ratio opening formed therein (shown filled with a portion of tungsten layer 15), a barrier material layer 14 deposited on the dielectric layer 12 to line the opening, and the tungsten layer 15 deposited on the barrier material layer 14. The tungsten layer 15 is formed using a conventional deposition process, e.g., a chemical vapor deposition (CVD) or atomic layer deposition (ALD) process where tungsten is conformally deposited (grown) on the patterned surface 11 to fill the opening. The tungsten layer 15 forms a tungsten feature 15A in the opening and an overburden of material (tungsten overburden layer 15B) on the field of the patterned surface 11.

In FIG. 1A, the opening has a non-uniform profile that is narrower at the surface of the substrate 10A and widens (bows outwardly) as the opening extends from the surface inwardly into the dielectric layer 12. As shown, overhanging portions of the conformal tungsten layer 15 have grown together to block or "pinch off" the entrance to the opening before the opening could be completely filled, thus causing the undesirable void 20, i.e., an absence of tungsten material, in the tungsten feature 15A. If the void 20 is opened (exposed) during the subsequent CMP process, polishing fluid may encroach into the tungsten feature 15A, and the chemically active components of the polishing fluid can cause further loss of the tungsten material therein, e.g., undesired feature coring (key-holing) through corrosion and/or static etch of the tungsten material. This undesirable tungsten loss may lead to device performance and reliability problems or, ultimately, to a complete failure of the device. Even without voiding, undesirable seaming in a tungsten feature is largely unavoidable using a conventional tungsten deposition process, such as shown in FIG. 1B.

Figure 1B:
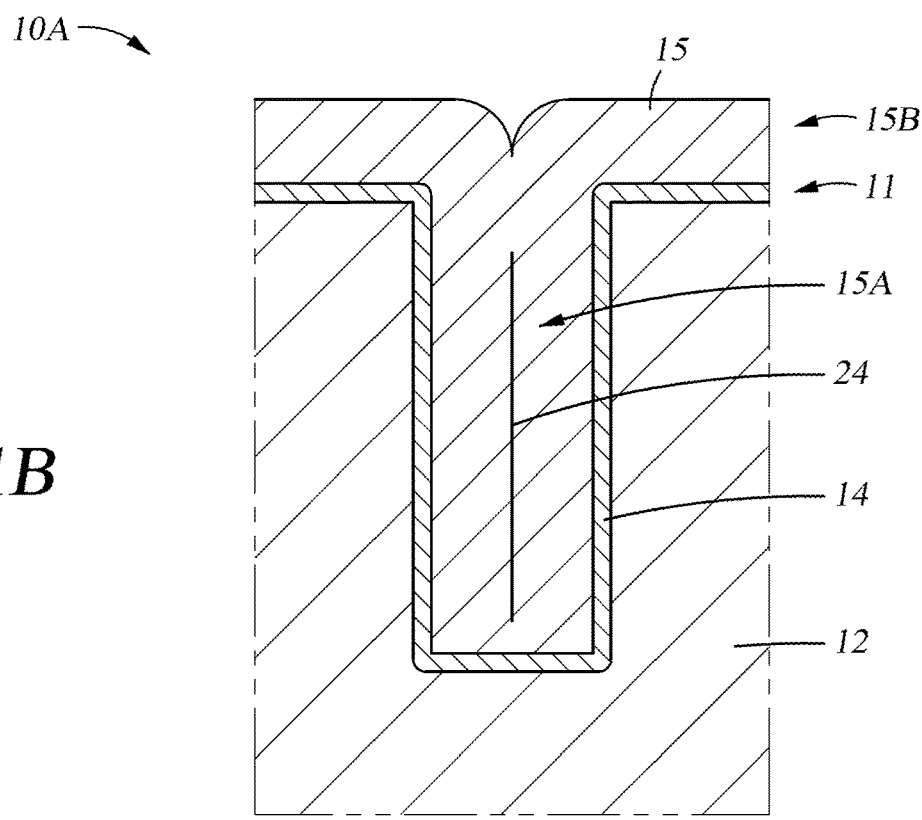

FIG. 1B is a schematic cross-sectional view of a substrate 10B illustrating an undesirable seam 24 formed during a conventional tungsten deposition process. Here, the patterned surface 11 includes an opening (filled with a portion of tungsten layer 15) having a substantially uniform profile as the opening extends from the surface of the substrate 10B into the dielectric layer 12. The opening is filled with tungsten, and no void is formed. Nonetheless, conformal growth of the tungsten layer 15 outwardly from the walls of the opening has resulted in an undesirable seam 24 extending through the center of a tungsten feature 15A formed in the opening. Like the void 20 shown in FIG. 1A, the seam 24 is vulnerable to corrosion from the chemically active components of the tungsten polishing fluid, which may cause undesirable loss of tungsten material from the feature 15A if the seam 24 is exposed during the CMP process.

Accordingly, embodiments herein provide a processing system that is configured to perform a combination of the individual aspects of the methods without transferring a substrate between processing chambers, thus improving overall substrate processing throughput and capacity for the tungsten gapfill processing schemes described herein.

Generally, the gapfill processing schemes include forming a differential tungsten deposition inhibition profile in feature openings formed in a surface of a substrate, filling the openings with tungsten material according to the inhibition profile, and depositing an overburden of tungsten on the field surface of the substrate. Forming the tungsten deposition inhibition profile typically includes forming a tungsten nucleation layer and treating the tungsten nucleation layer using an activated nitrogen species, e.g., treatment radicals. The nitrogen treatment radicals are incorporated into portions of the nucleation layer, e.g., by adsorption of the nitrogen species and/or by reaction with the metallic tungsten of the nucleation layer to form tungsten nitride (WN). The adsorbed nitrogen and/or nitrided surface of the tungsten nucleation layer desirably delays (inhibits) tungsten nucleation and thus subsequent tungsten deposition thereon.

In some embodiments, the treatment radicals are formed remotely from a substrate processing chamber by use of a remote plasma source fluidly coupled thereto. The desired inhibition effect on the field of the patterned surface and the desired inhibition profile in the openings formed in the patterned surface is achieved by controlling processing conditions within the processing chamber, such as temperature and pressure, and controlling the concentration, flux, and energy of the treatment radicals at the substrate surface. Typically, the treatment radicals are formed from a non-halogen nitrogen-containing gas, such as $N_2$, $NH_3$, $NH_4$, or combinations thereof.

The tungsten nucleation and deposition processes of the gapfill processing scheme generally include flowing a tungsten-containing precursor and a reducing agent into the processing chamber and exposing the substrate surface thereto. The tungsten-containing precursor and the reducing agent react on the surface of the substrate in one of a chemical vapor deposition (CVD) process, a pulsed CVD process, an atomic layer deposition (ALD) process, or a combination thereof to deposit tungsten material thereon.

The processing systems described herein are configured to periodically perform a chamber cleaning operation where the undesired tungsten residues are removed from the interior surfaces of the processing chamber using a cleaning chemistry, such as a cleaning chemistry including an activated halogen species, e.g., fluorine or chlorine (cleaning) radicals, formed remotely from the processing chamber.

The chamber cleaning operation generally includes flowing the halogen cleaning radicals into the processing chamber, reacting the cleaning radicals with the tungsten residue to form a volatile tungsten species, and evacuating the volatile tungsten species from the processing chamber through an exhaust. The chamber cleaning operation is typically performed between substrate processing, i.e., after a processed substrate has been removed from the processing chamber and before a subsequent to-be-processed processed substrate has been received into the processing chamber.

Figure 2A:
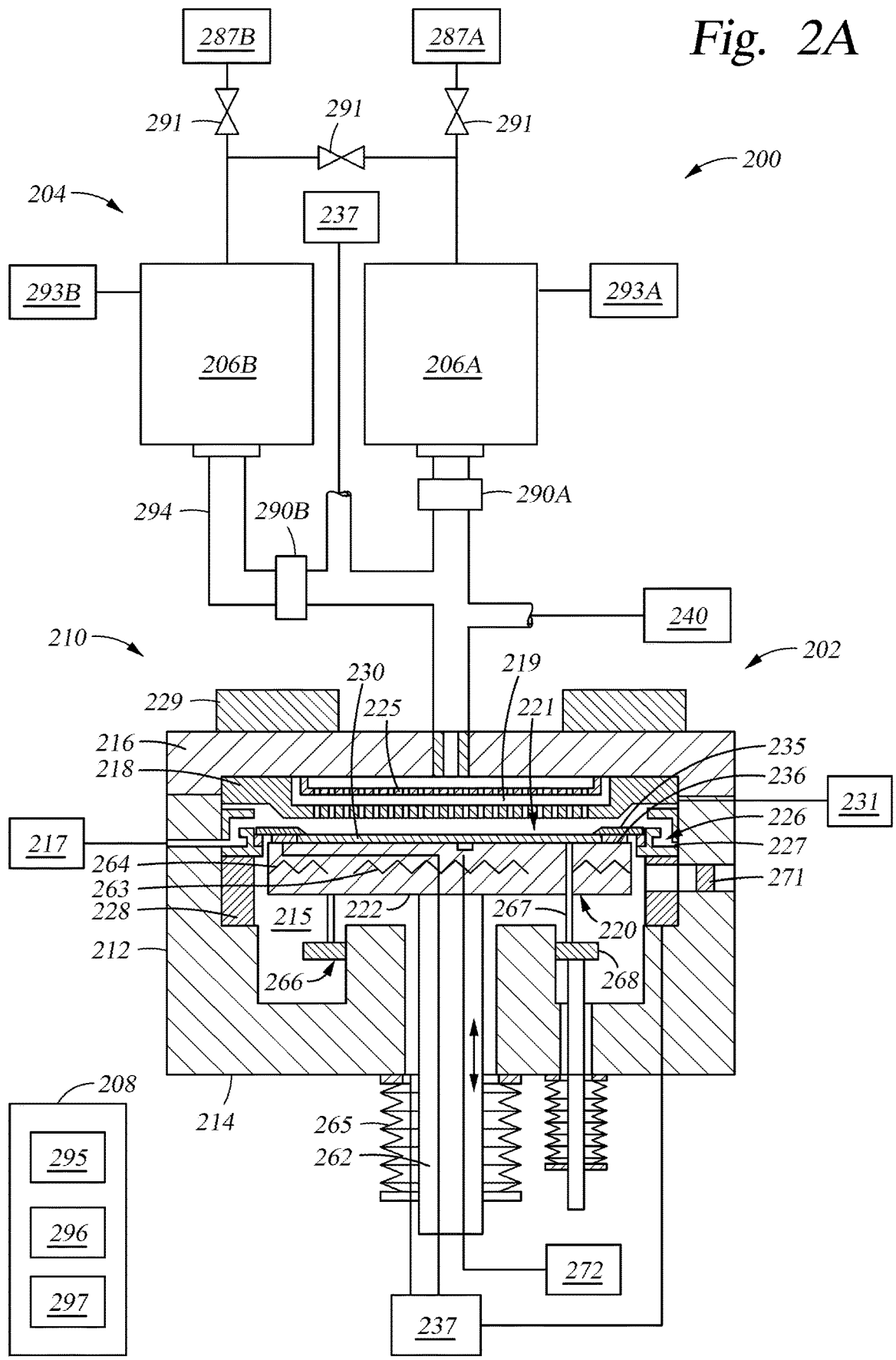
FIG. 2A is a schematic side view of a processing system that may be used to implement the methods set forth herein, according to one embodiment.
Figure 2B:
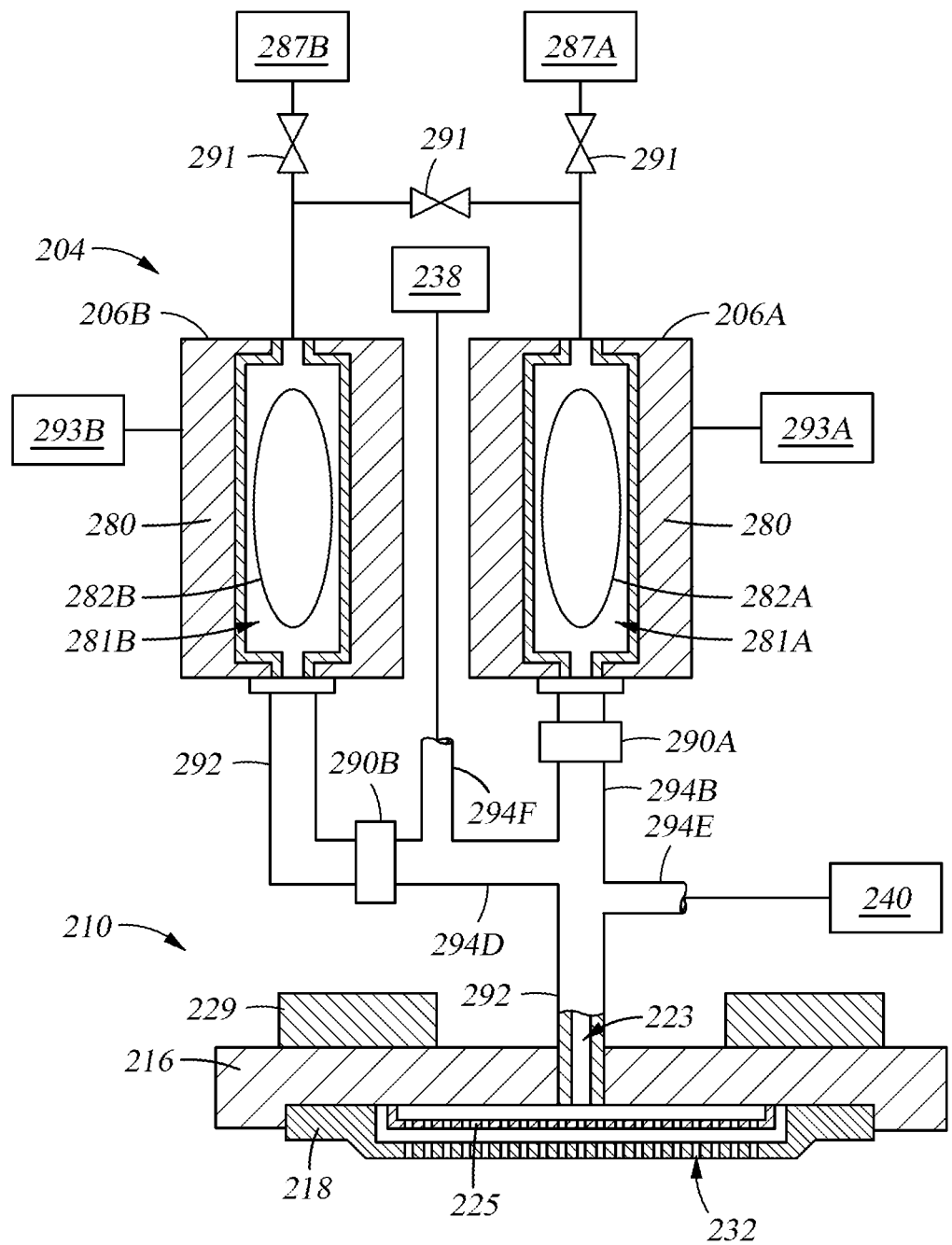
FIG. 2B is a close-up sectional view of a portion of the processing system shown in FIG. 2A, according to one embodiment.

FIGS. 2A-2B schematically illustrate a processing system 200 that may be used to perform the bottom-up tungsten gapfill substrate processing methods described herein. Here, the processing system is configured to provide the different processing conditions desired for each of a nucleation process, inhibition treatment process, selective gapfill process, and overburden deposition process within a single processing chamber 202, i.e., without transferring a substrate between a plurality of processing chambers.

As shown in FIG. 2A, the processing system 200 includes a processing chamber 202, a gas delivery system 204 fluidly coupled to the processing chamber 202, and a system controller 208. The processing chamber 202 (shown in cross-section in FIG. 2A) includes a chamber lid assembly 210, one or more sidewalls 212, and a chamber base 214, which collectively define a processing volume 215. The processing volume 215 is fluidly coupled to an exhaust 217, such as one or more vacuum pumps, used to maintain the processing volume 215 at sub-atmospheric conditions and to evacuate processing gases and processing by-products therefrom.

The chamber lid assembly 210 includes a lid plate 216 and a showerhead 218 coupled to the lid plate 216 to define a gas distribution volume 219 therewith. Here, the lid plate 216 is maintained at a desired temperature using one or more heaters 229 thermally coupled thereto. The showerhead 218 faces a substrate support assembly 220 disposed in the processing volume 215. As discussed below, the substrate support assembly 220 is configured to move a substrate support 222, and thus a substrate 230 disposed on the substrate support 222, between a raised substrate processing position (as shown) and a lowered substrate transfer position (not shown). When the substrate support assembly 220 is in the raised substrate processing position, the showerhead 218 and the substrate support 222 define a processing region 221.

The gas delivery system 204 is fluidly coupled to the processing chamber 202 through a gas inlet 223 (FIG. 2B) that is disposed through the lid plate 216. Processing or cleaning gases delivered, by use of the gas delivery system 204, flow through the gas inlet 223 into the gas distribution volume 219 and are distributed into the processing region 221 through a plurality of openings 232 (FIG. 2B) in the showerhead 218. In some embodiments, the chamber lid assembly 210 further includes a perforated blocker plate 225 disposed between the gas inlet 223 and the showerhead 218. In those embodiments, gases flowed into the gas distribution volume 219 are first diffused by the blocker plate 225 to, together with the showerhead 218, provide a more uniform or desired distribution of gas flow into the processing region 221.

The processing gases and processing by-products are evacuated radially outward from the processing region 221 through an annular channel 226 that surrounds the processing region 221. The annular channel 226 may be formed in a first annular liner 227 disposed radially inward of the one or more sidewalls 212 (as shown) or may be formed in the one or more sidewalls 212. In some embodiments, the processing chamber 202 includes one or more second liners 228, which are used to protect the interior surfaces of the one or more sidewalls 212 or chamber base 214 from corrosive gases and/or undesired material deposition.

In some embodiments, a purge gas source 237 in fluid communication with the processing volume 215 is used to flow a chemically inert purge gas, such as argon (Ar), into a region disposed beneath the substrate support 222, e.g., through the opening in the chamber base 214 surrounding a support shaft 262. The purge gas may be used to create a region of positive pressure below the substrate support 222 (when compared to the pressure in the processing region 221) during substrate processing. Typically, purge gas introduced through the chamber base 214 flows upwardly therefrom and around the edges of the substrate support 222 to be evacuated from the processing volume 215 through the annular channel 226. The purge gas reduces undesirable material deposition on surfaces beneath the substrate support 222 by reducing and/or preventing the flow of material precursor gases thereinto.

The substrate support assembly 220 includes a movable support shaft 262 that sealingly extends through the chamber base 214, such as being surrounded by a bellows 265 in the region below the chamber base 214, and the substrate support 222, which is disposed on the movable support shaft 262. To facilitate substrate transfer to and from the substrate support 222, the substrate support assembly 220 includes a lift pin assembly 266 comprising a plurality of lift pins 267 coupled to or disposed in engagement with a lift pin hoop 268. The plurality of lift pins 267 are movably disposed in openings formed through the substrate support 222. When the substrate support 222 is disposed in a lowered substrate transfer position (not shown), the plurality of lift pins 267 extend above a substrate receiving surface of the substrate support 222 to lift a substrate 230 therefrom and provide access to a backside (non-active) surface of the substrate 230 by a substrate handler (not shown). When the substrate support 222 is in a raised or processing position (as shown), the plurality of lift pins 267 recede beneath the substrate receiving surface of the substrate support 222 to allow the substrate 230 to rest thereon.

The substrate 230 is transferred to and from the substrate support 222 through a door 271, e.g., a slit valve disposed in one of the one or more sidewalls 212. Here, one or more openings in a region surrounding the door 271, e.g., openings in a door housing, are fluidly coupled to a purge gas source 237, e.g., an Ar gas source. The purge gas is used to prevent processing and cleaning gases from contacting and/or degrading a seal surrounding the door, thus extending the useful lifetime thereof.

The substrate support 222 is configured for vacuum chucking where the substrate 230 is secured to the substrate support 222 by applying a vacuum to an interface between the substrate 230 and the substrate receiving surface. The vacuum is applied use of a vacuum source 272 fluidly coupled to one or more channels or ports formed in the substrate receiving surface of the substrate support 222. In other embodiments, e.g., where the processing chamber 202 is configured for direct plasma processing, the substrate support 222 may be configured for electrostatic chucking. In some embodiments, the substrate support 222 includes one or more electrodes (not shown) coupled to a bias voltage power supply (not shown), such as a continuous wave (CW) RF power supply or a pulsed RF power supply, which supplies a bias voltage thereto.

As shown, the substrate support assembly 220 features a dual-zone temperature control system to provide independent temperature control within different regions of the substrate support 222. The different temperature-controlled regions of the substrate support 222 correspond to different regions of the substrate 230 disposed thereon. Here, the temperature control system includes a first heater 263 and a second heater 264. The first heater 263 is disposed in a central region of the substrate support 222, and the second heater 264 is disposed radially outward from the central region to surround the first heater. In other embodiments, the substrate support 222 may have a single heater or more than two heaters.

In some embodiments, the substrate support assembly 220 further includes an annular shadow ring 235, which is used to prevent undesired material deposition on a circumferential bevel edge of the substrate 230. During substrate transfer to and from the substrate support 222, i.e., when the substrate support assembly 220 is disposed in a lowered position (not shown), the shadow ring 235 rests on an annular ledge within the processing volume 215. When the substrate support assembly 220 is disposed in a raised or processing position, the radially outward surface of the substrate support 222 engages with the annular shadow ring 235 so that the shadow ring 235 circumscribes the substrate 230 disposed on the substrate support 222. Here, the shadow ring 235 is shaped so that a radially inward facing portion of the shadow ring 235 is disposed above the bevel edge of the substrate 230 when the substrate support assembly 220 is in the raised substrate processing position.

In some embodiments, the substrate support assembly 220 further includes an annular purge ring 236 disposed on the substrate support 222 to circumscribe the substrate 230. In those embodiments, the shadow ring 235 may be disposed on the purge ring 236 when the substrate support assembly 220 is in the raised substrate processing position. Typically, the purge ring 236 features a plurality of radially inward facing openings that are in fluid communication with the purge gas source 237. During substrate processing, a purge gas flows into an annular region defined by the shadow ring 235, the purge ring 236, the substrate support 222, and the bevel edge of the substrate 230 to prevent processing gases from entering the annular region and causing undesired material deposition on the bevel edge of the substrate 230.

In some embodiments, the processing chamber 202 is configured for direct plasma processing. In those embodiments, the showerhead 218 may be electrically coupled to a first power supply 231, such as an RF power supply, which supplies power to ignite and maintain a plasma of processing gases flowed into the processing region 221 through capacitive coupling therewith. In some embodiments, the processing chamber 202 comprises an inductive plasma generator (not shown), and a plasma is formed through inductively coupling an RF power to the processing gas.

The processing system 200 is advantageously configured to perform each of the tungsten nucleation, inhibition treatment, and bulk tungsten deposition processes of a void-free and seam-free tungsten gapfill process scheme without removing the substrate 230 from the processing chamber 202. The gases used to perform the individual processes of the gapfill process scheme, and to clean residues from the interior surfaces of the processing chamber, are delivered to the processing chamber 202 using the gas delivery system 204 fluidly coupled thereto.

Generally, the gas delivery system 204 includes one or more remote plasma sources, here the first and second radical generator 206A-B, a deposition gas source 240, and a conduit system 294 (e.g., the plurality of conduits 294A-F) fluidly coupling the radical generators 206A-B and the deposition gas source 240 to the lid assembly 210. The gas delivery system 204 further includes a plurality of isolation valves, here the first and second valves 290A-B, respectively disposed between the radical generators 206A-B and the lid plate 216, which may be used to fluidly isolate each of the radical generators 206A-B from the processing chamber 202 and from one another.

Each of the radical generators 206A-B features a chamber body 280 that defines the respective first and second plasma chamber volumes 281A-B (FIG. 2B). Each of the radical generators 206A-B is coupled to a respective power supply 293A-B. The power supplies 293A-B are used to ignite and maintain a plasma 282A-B of gases delivered to the plasma chamber volumes 281A-B from a corresponding first or second gas source 287A-B fluidly coupled thereto. In some embodiments, the first radical generator 206A generates radicals used in the differential inhibition process. For example, the first radical generator 206A may be used to ignite and maintain a treatment plasma 282A from a non-halogen-containing gas mixture delivered to the first plasma chamber volume 281A from the first gas source 287A. The second radical generator 206B may be used to generate cleaning radicals used in a chamber clean process by igniting and maintaining a cleaning plasma 282B from a halogen-containing gas mixture delivered to the second plasma chamber volume 281B from the second gas source 287B.

Typically, nitrogen treatment radicals have a relativity short lifetime (when compared to halogen cleaning radicals) and may exhibit a relatively high sensitivity to recombination from collisions with surfaces in the gas delivery system 204 and/or with other species of the treatment plasma effluent. Thus, in embodiments herein, the first radical generator 206A is typically positioned closer to the gas inlet 223 than the second radical generator 206B, e.g., to provide a relatively shorter travel distance from the first plasma chamber volume 281A to the processing region 221.

In some embodiments, the first radical generator 206A is also fluidly coupled to the second gas source 287B, which delivers a halogen-containing conditioning gas to the first plasma chamber volume 281A to be used in a plasma source condition process. In those embodiments, the gas delivery system 204 may further include a plurality of diverter valves 291, which are operable to direct the halogen-containing gas mixture from the second gas source 287B to the first plasma chamber volume 281A.

Suitable remote plasma sources which may be used for one or both of the radical generators 206A-B include radio frequency (RF) or very high radio frequency (VHRF) capacitively coupled plasma (CCP) sources, inductively coupled plasma (ICP) sources, microwave-induced (MW) plasma sources, electron cyclotron resonance (ECR) chambers, or high-density plasma (HDP) chambers.

As shown, the first radical generator 206A is fluidly coupled to the processing chamber 202 by use of first and second conduits 294A-B, which extend upwardly from the gas inlet 223 to connect with an outlet of the first plasma chamber volume 281A. A first valve 290A, disposed between the first and second conduits 294A-B, is used to selectively fluidly isolate the first radical generator 206A from the processing chamber 202 and the other portions of the gas delivery system 204. Typically, the first valve 290A is closed during the chamber clean process to prevent activated cleaning gases, e.g., halogen radicals, from flowing into the first plasma chamber volume 281A and damaging the surfaces thereof.

The second radical generator 206B is fluidly coupled to the second conduit 294B, and thus the processing chamber 202, by use of third and fourth conduits 294C-D. The second radical generator 206B is selectively isolated from the processing chamber 202 and from the other portions of the gas delivery system 204 by use of a second valve 290B that is disposed between the third and fourth conduits 294C-D.

Deposition gases, e.g., tungsten-containing precursors and reducing agents, are delivered from the deposition gas source 240 to the processing chamber 202 using a fifth conduit 294E. As shown, the fifth conduit 294E is coupled to the second conduit 294B at a location proximate to the gas inlet 223 so that the first and second valves 290A-B may be used to respectively isolate the first and second radical generators 206A-B from deposition gases introduced into the processing chamber 202. In some embodiments, the gas delivery system 204 further includes a sixth conduit 294F which is coupled to the fourth conduit 294D at a location proximate to the second valve 290B. The sixth conduit 294F, is fluidly coupled to a bypass gas source 238, e.g., an argon (Ar) gas source, which may be used to periodically purge portions of the gas delivery system 204 of undesired residual cleaning, inhibition, and/or deposition gases.

Operation of the processing system 200 is facilitated by the system controller 208. The system controller 208 includes a programmable central processing unit, here the CPU 295, which is operable with a memory 296 (e.g., non-volatile memory) and support circuits 297. The CPU 295 is one of any form of general-purpose computer processor used in an industrial setting, such as a programmable logic controller (PLC), for controlling various chamber components and sub-processors. The memory 296, coupled to the CPU 295, facilitates the operation of the processing chamber. The support circuits 297 are conventionally coupled to the CPU 295 and comprise cache, clock circuits, input/output subsystems, power supplies, and the like, and combinations thereof coupled to the various components of the processing system 200 to facilitate control of substrate processing operations therewith.

The instructions in memory 296 are in the form of a program product, such as a program that implements the methods of the present disclosure. In one example, the disclosure may be implemented as a program product stored on computer-readable storage media for use with a computer system. The program(s) of the program product define functions of the embodiments (including the methods described herein). Thus, the computer-readable storage media, when carrying computer-readable instructions that direct the functions of the methods described herein, are embodiments of the present disclosure.

The processing system 200 described above may be used to perform each of the nucleation, inhibition, gapfill deposition, thus providing a single-chamber seam-free tungsten gapfill solution.

Figure 3:
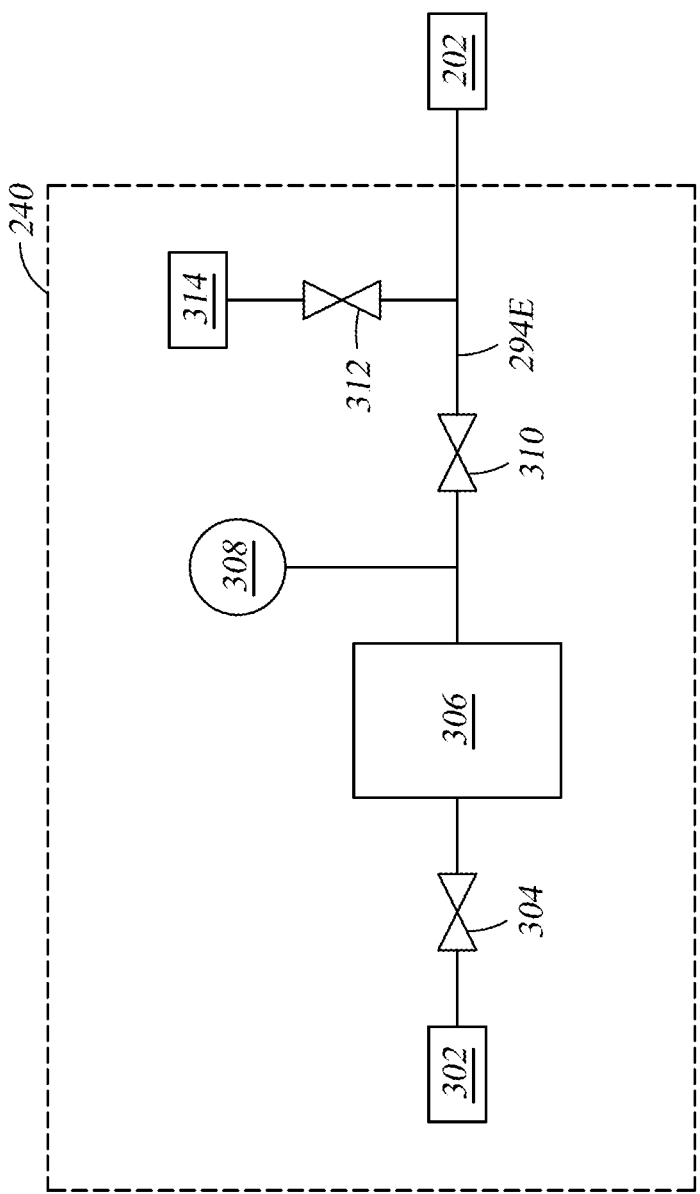
FIG. 3 is a close-up sectional view of a portion of the processing system shown in FIG. 2A, according to one embodiment.

FIG. 3 is a close-up sectional view of the deposition gas source 240 of the processing system shown in FIG. 2A, according to one embodiment. The deposition gas source 240 includes a first gas source 302, such as a reducing agent gas source, and a second gas source 314, such as a tungsten-containing precursor. The reducing agent gas source 302 is in fluid communication with a reservoir 306. The reservoir 306 is continuously filled with the reducing gas source 302, or is refilled using refill valve 304. The reservoir 306 pressure is monitored using a pressure gauge 308. It has been discovered that using a reservoir 306 enables a quick release of high amount of gas into the process chamber 202. The large amount of gas is released at large gas flow rates (e.g., about 200 sccm or greater, such as about 300 sccm or greater) of reducing gas to be flowed into the process chamber 202 during operation, such as during pulsing. The reducing gas is released from the reservoir 306 to the chamber 202 via valve 310 disposed along the conduit 294E. The second gas source 314 is in fluid communication with the chamber 202 via the conduit 294E. The second gas source 314 flows the tungsten-containing precursor to the chamber 202 via valve 312. One or more of the valves 304, 310, and 312 are controlled using a controller, such as the system controller 208. In some embodiments, one or more of the valves are switched between open and closed states for predetermined amounts of time at predetermined intervals depending on operating parameters.

Figure 4:
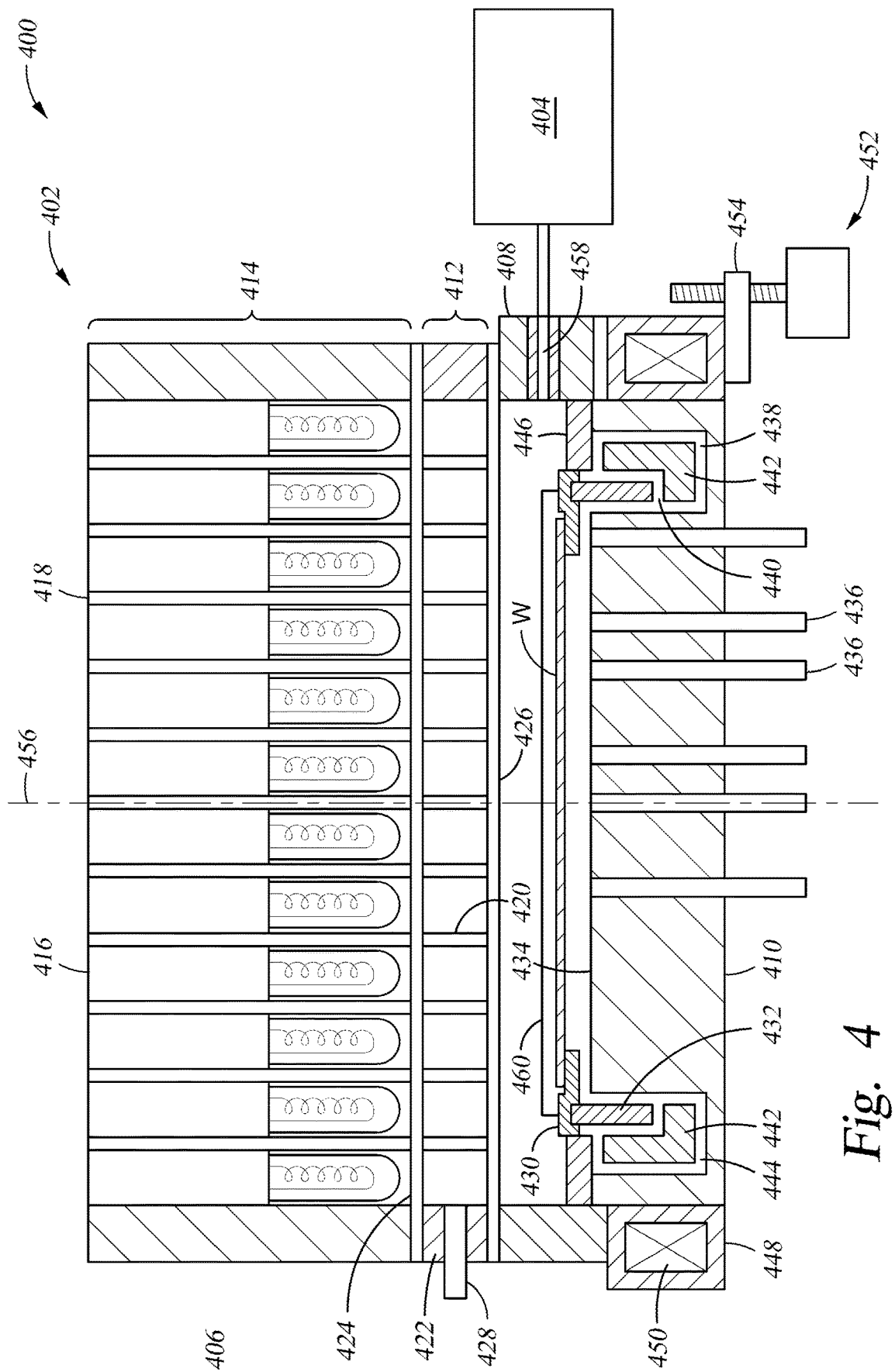
FIG. 4 depicts a schematic side view of a rapid thermal processing system that may be used to implement the methods set forth herein, according to one embodiment.

After processing the substrate in process chamber 202, the substrate is transferred to a second processing system to anneal the substrate, such as the substrate processing system 400 depicted in FIG. 4. The substrate processing system 400 may be a rapid thermal processing (RTP) apparatus. The substrate processing system 400 includes a thermal processing chamber 402 and a process gas source 404 that couples to the thermal processing chamber 402 and is used to provide process gas to a processing region 406 of the thermal processing chamber 402. The processing region 406 is enclosed by one or more sidewalls 408 (e.g., four sidewalls or single sidewall for circular process region 406) and a base 410. The upper portion of the sidewall 408 may be sealed to a window assembly 412 (e.g., using "O" rings). A radiant energy assembly 414 is positioned over and coupled to window assembly 412. The radiant energy assembly 414 has a plurality of lamps 416, which may be tungsten halogen lamps, each mounted into a receptacle 418 and positioned to emit electromagnetic radiation into the processing region 406. The window assembly 412 of FIG. 4 has a plurality of light pipes 420, but the window assembly 412 may just have a flat, solid window with no light pipes. The window assembly 412 has an outer wall 422 (e.g., a cylindrical outer wall) that forms a rim enclosing the window assembly 412 around a circumference thereof. The window assembly 412 also has a first window 424 covering a first end of the plurality of light pipes 420 and a second window 426 covering a second end of the plurality of light pipes 420, opposite the first end. The first window 424 and second window 426 extend to, and engage with, the outer wall 422 of the window assembly 412 to enclose and seal the interior of the window assembly 412, which includes the plurality of light pipes 420. In such cases, when light pipes are used, a vacuum can be produced in the plurality of light pipes 420 by applying vacuum through a conduit 428 through the outer wall 422 to one of the plurality of light pipes 420, which is in turn fluidly connected to the rest of the light pipes.

A substrate W is supported in the thermal processing chamber 402 by a support ring 430 within the processing region 406. The support ring 430 is mounted on a rotatable cylinder 432. By rotating the rotatable cylinder 432, the support ring 430 and substrate W are caused to rotate during processing. The base 410 of the thermal processing chamber 402 has a reflective surface 434 for reflecting energy onto the backside of the substrate W during processing. Alternatively, a separate reflector (not shown) can be positioned between the base 410 of the thermal processing chamber 402 and the support ring 430. The thermal processing chamber 402 may include a plurality of temperature probes 436 disposed through the base 410 of the thermal processing chamber 402 to detect the temperature of the substrate W. In the event a separate reflector is used, as described above, the temperature probes 436 are also disposed through the separate reflector for optical access to electromagnetic radiation coming from the substrate W.

The rotatable cylinder 432 is supported by a magnetic rotor 438, which is a cylindrical member having a ledge 440 on which the rotatable cylinder 432 rests when both members are installed in the thermal processing chamber 402. The magnetic rotor 438 has a plurality of magnets in a magnet region 442 below the ledge 440. The magnetic rotor 438 is disposed in an annular well 444 located at a peripheral region of the thermal processing chamber 402 along the base 410. A cover 446 rests on a peripheral portion of the base 410 and extends over the annular well 444 toward the rotatable cylinder 432 and support ring 430, leaving a tolerance gap between the cover 446 and the rotatable cylinder 432 and/or the support ring 430. The cover 446 generally protects the magnetic rotor 438 from exposure to process conditions in the processing region 406.

The magnetic rotor 438 is rotated by magnetic energy from a magnetic stator 448 disposed around the base 410. The magnetic stator 448 has a plurality of electromagnets 450 that, during processing of the substrate W, are powered according to a rotating pattern to form a rotating magnetic field that provides magnetic energy to rotate the magnetic rotor 438. The magnetic stator 448 is coupled to a linear actuator 452 by a support 454. Operating the linear actuator 452 moves the magnetic stator 448 along an axis 456 of the thermal processing chamber 402, which in turn moves the magnetic rotor 438, the rotatable cylinder 432, the support ring 430, and the substrate W along the axis 456.

Processing gas is provided to the thermal processing chamber 402 through a chamber inlet 458, and exhausts through a chamber outlet oriented out of the page and generally along the same plane as the chamber inlet 458 and the support ring 430 (not shown in FIG. 4). Substrates enter and exit the thermal processing chamber 402 through an access port 460 formed in the sidewall 408 and shown at the rear in FIG. 4.

Although a single gas source 404 is depicted in FIG. 4, additional gas sources are also contemplated. The gas source 404 may also be coupled to a plasma initiator (not shown) to provide radicals remotely to the process volume. The gas source 404 may be, or include, one or more of a nitrogen-containing gas, an oxygen-containing gas, a silicon-containing gas, a hydrogen-containing gas, or a plasma forming gas such as argon or helium.

Figure 5:
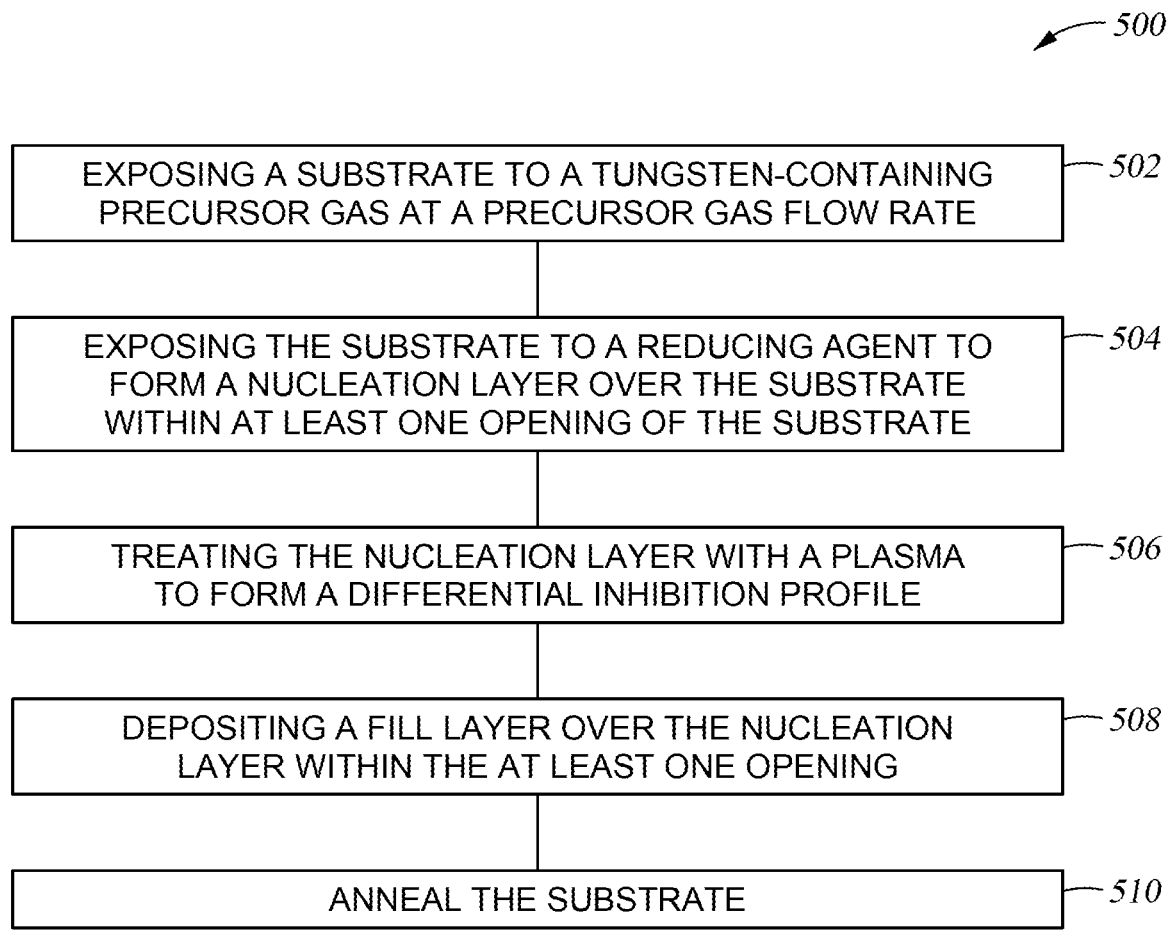
FIG. 5 is a diagram illustrating a method of processing a substrate, according to one embodiment.

FIG. 5 is a diagram illustrating a method 500 of processing a substrate, according to an embodiment, which may be performed using the processing system 200 and the processing system 400. FIGS. 6A-6C are schematic sectional views of a portion of a substrate 600 illustrating aspects of the method 500 at different stages of a void-free and seam-free tungsten gapfill process scheme.

The substrate 600 features a patterned surface 601 including a dielectric material layer 602 having a plurality of openings 605 (one shown) formed therein. In some embodiments, the plurality of openings 605 include one or a combination of high aspect ratio via or trench openings having a width of about 1 µm or less, such as about 800 nm or less, or about 500 nm or less, and a depth of about 2 µm or more, such as about 3 µm or more, or about 4 µm or more. In some embodiments, individual ones of the openings 605 may have an aspect ratio (depth to width ratio) of about 3:1 or more, such as about 5:1 or more, 10:1 or more. In some embodiments, the vias or trench openings are about 20 nm to about 50 nm having aspect ratios of about 3:1 to about 10:1.

As shown, the patterned surface 601 includes a barrier or adhesion layer 603, e.g., a titanium nitride (TiN) layer, deposited on the dielectric material layer 602 to conformally line the openings 605 and facilitate the subsequent deposition of a tungsten nucleation layer 604. In some embodiments, the adhesion layer 603 is deposited to a thickness of between about 20 angstroms (Å) and about 150 Å, such as about 30 Å to about 100 Å.

At operation 502, the method 500 includes exposing a substrate with adhesion layer 603 to a tungsten-containing precursor gas at a precursor gas flow rate. At operation 504, the substrate is exposed to a reducing agent at a reducing agent flow rate. Operations 502 and 504 are cyclically alternated, beginning with either 502 or 504. In some embodiments, operations 502 and 504 are cyclically alternated beginning with operation 502 and ending in operation 504. Operations 502 and 504 together form the nucleation layer 604 on the substrate using a nucleation process. The reducing agent gas flow rate to precursor agent flow rate ratio is about 5:1 or greater, such as about 6:1 to about 10:1, by volume. A portion of an exemplary substrate 600 having the nucleation layer 604 formed thereon is schematically illustrated in FIG. 6A.

In some embodiments, the nucleation layer 604 is deposited using an atomic layer deposition (ALD) process. The ALD process includes repeating cycles of alternately exposing the substrate 600 to a tungsten-containing precursor and exposing the substrate 600 to a reducing agent. In some embodiments, the processing region 221 is purged between the alternating exposures. In some embodiments, the process region 221 is continuously purged during operations 402 and 404. Examples of suitable tungsten-containing precursors include tungsten halides, such as tungsten hexafluoride ($WF_6$), tungsten hexachloride ($WCl_6$), or combinations thereof. In some embodiments, the tungsten-containing precursor includes $WF_6$, and the reducing agent includes a boron-containing agent, such as $B_2H_6$. In some embodiments, the tungsten-containing precursor comprises an organometallic precursor and/or a fluorine-free precursor, e.g., MDNOW (methylcyclopentadienyl-dicarbonylnitrosyl-tungsten), EDNOW (ethylcyclopentadienyl-dicarbonylnitrosyl-tungsten), tungsten hexacarbonyl ($W(CO)_6$), or combinations thereof.

During the nucleation process, the processing volume 215 is maintained at a pressure of less than about 120 Torr, such as of between about 900 mTorr and about 120 Torr, between about 1 Torr and about 100 Torr, or for example, between about 1 Torr and about 50 Torr. Exposing the substrate 600 to the tungsten-containing precursor includes flowing the tungsten-containing precursor into the processing region 221 from the deposition gas source 240 at a flow rate of about 100 sccm or less, such as about 10 sccm to about 60 sccm, or about 20 sccm to about 80 sccm. Exposing the substrate 600 to the reducing agent includes flowing the reducing agent into the processing region 221 from the deposition gas source 240 at a flow rate of about 200 sccm to about 1000 sccm, such as between about 300 sccm and about 750 sccm. It has been discovered that the gas deposition source 240 described in FIG. 3 is particularly useful for flowing at gas flow rates from the reducing gas source 302 via reservoir 306 of about 100 sccm or greater, such as about 300 sccm or greater.

It should be noted that the flow rates for the various deposition and treatment processes described herein are for a processing system 200 configured to process a 300 mm diameter substrate. Appropriate scaling may be used for processing systems configured to process different-sized substrates.

The tungsten-containing precursor and the reducing agent are each flowed into the processing region 221 for a duration of between about 0.1 seconds and about 10 seconds, such as between about 0.5 seconds and about 5 seconds. The processing region 221 may be purged between the alternating exposures by flowing a purge gas, such as argon (Ar) or hydrogen gas, into the processing region 221 for a duration of between about 0.1 seconds and about 10 seconds, such as between about 0.5 seconds and about 5 seconds. The purge gas may be delivered from the deposition gas source 240 or from the bypass gas source 238. Typically, the repeating cycles of the nucleation process continue until the nucleation layer 404 has a thickness of between about 10 Å and about 200 Å, such as between about 10 Å and about 150 Å, or between about 20 Å and about 150 Å. The nucleation layer 604 is disposed along sidewalls of the opening 605, such as over the barrier or adhesion layer 603. The nucleation layer has an atomic ratio of boron to tungsten of about 1:n where n is about 5 or less, such as about 1:4.5 to about 1:1, such as about 1:4 to about 1:2, or about 1:3 to 3:4, such as about 1.1:1 to about 2:1.

At operation 506, the method 500 includes treating the nucleation layer 604 to inhibit tungsten deposition on a field surface of the substrate 600 and to form a differential inhibition profile in the plurality of openings 605 by use of a differential inhibition process. Typically, forming the differential inhibition profile includes exposing the nucleation layer 604 to the activated species of a treatment gas, e.g., the treatment radicals 606 shown in FIG. 6B. Suitable treatment gases that may be used for the inhibition process include $N_2$, $H_2$, $NH_3$, $NH_4$, $O_2$, $CH_4$, or combinations thereof. In some embodiments, the treatment gas comprises nitrogen, such as $N_2$, $H_2$, $NH_3$, $NH_4$, or a combination thereof, and the activated species comprise nitrogen radicals, e.g., atomic nitrogen. In some embodiments, the treatment gas is combined with an inert carrier gas, such as Ar, He, or a combination thereof, to form a treatment gas mixture.

Without intending to be bound by theory, it is believed that the activated nitrogen species (treatment radicals 606) are incorporated into portions of the nucleation layer 604 by adsorption of the activated nitrogen species and/or by reaction with the metallic tungsten of the nucleation layer 604 to form a tungsten nitride (WN) surface. The adsorbed nitrogen and/or nitrided surface of the tungsten nucleation layer 604 desirably delays (inhibits) further tungsten nucleation and thus subsequent tungsten deposition thereon.

In some embodiments, exposing the nucleation layer 604 to the treatment radicals 606 includes forming a treatment plasma 282A of a substantially halogen-free treatment gas mixture using the first radical generator 206A and flowing the effluent of the treatment plasma 282A into the processing region 221. In some embodiments, a flow rate of the treatment gas mixture into the first radical generator 206A, and thus the flow rate of the treatment plasma effluent into the processing region 221, is between about 1 sccm and about 3000 sccm, such as between about 1 sccm and about 2500 sccm, between about 1 sccm and about 2000 sccm, between about 1 sccm and about 1000 sccm, between about 1 sccm and about 500 sccm, between about 1 sccm and about 250 sccm between about 1 sccm and about 100 sccm, or between about 1 sccm and about 75 sccm, for example, between about 1 sccm and about 50 sccm.

In some embodiments, the inhibition treatment process includes exposing the substrate 600 to the treatment radicals 606 for a period of about 2 seconds or more, such as about 4 seconds or more, about 6 seconds or more, about 8 seconds or more, about 9 seconds or more, about 10 seconds to about 20 seconds.

In some embodiments, a concentration of the substantially halogen-free treatment gas in the treatment gas mixture is about 0.1 vol. % to about 50 vol. %, such as about 0.2 vol. % to about 40 vol. %, about 0.2 vol. % to about 30 vol. %, about 0.2 vol. % and about 20 vol. %, or, for example, between about 0.2 vol. % and about 10 vol. %, such as between about 0.2 vol. % and about 5 vol. %.

In other embodiments, the treatment radicals 606 may be formed using a remote plasma (not shown) which is ignited and maintained in a portion of the processing volume 215 that is separated from the processing region 221 by the showerhead 218, such as between the showerhead 218 and the lid plate 216. In those embodiments, the activated treatment gas may be flowed through an ion filter to remove substantially all ions therefrom before the treatment radicals 606 reach the processing region 221 and the surface of the substrate 600. In some embodiments, the showerhead 218 may be used as the ion filter. In other embodiments, a plasma used to form the treatment radicals is an in-situ plasma formed in the processing region 221 between the showerhead 218 and the substrate 600. In some embodiments, e.g., when using an in-situ treatment plasma, the substrate 600 may be biased to control the directionality and/or accelerate ions formed from the treatment gas, e.g., charged treatment radicals, towards the substrate surface.

In some embodiments, the inhibition treatment process includes maintaining the processing volume 215 at a pressure of less than about 100 Torr while flowing the activated treatment gas thereinto. For example, during the inhibition treatment process, the processing volume 215 may be maintained at a pressure of less than about 75 Torr, such as less than about 50 Torr, less than about 25 Torr, less than about 15 Torr, or between about 0.5 Torr and about 120 Torr, such as between about 0.5 Torr and about 100 Torr, or between about 0.5 Torr and about 50 Torr, or for example, between about 1 Torr and about 10 Torr.

At operation 508, the method 500 includes depositing a tungsten gapfill material 608 (FIG. 6C) into the plurality of openings 605 according to the differential inhibition profile provided by the inhibition treatment at operation 206. In one embodiment, the tungsten gapfill material 608 is formed using a chemical vapor deposition (CVD) process comprising concurrently flowing (co-flowing) a tungsten-containing precursor gas, and a reducing agent into the processing region 221 and exposing the substrate 600 thereto. The tungsten-containing precursor and the reducing agent used for the tungsten gapfill CVD process may comprise any combination of the tungsten-containing precursors and reducing agents described with reference to operations 502 and 504. In some embodiments, the tungsten-containing precursor comprises $WF_6$, and the reducing agent includes hydrogen gas.

The tungsten-containing precursor is flowed into the processing region 221 at a rate of between about 10 sccm and about 1000 sccm, or more than about 50 sccm, or less than about 1000 sccm, or between about 100 sccm and about 900 sccm. The reducing agent is flowed into the processing region 221 at a rate of more than about 500 sccm, such as more than about 750 sccm, more than about 1000 sccm, or between about 500 sccm and about 10000 sccm, such as between about 1000 sccm and about 9000 sccm, or between about 1000 sccm and about 8000 sccm.

In some embodiments, the tungsten gapfill CVD process conditions are selected to provide a tungsten feature having a relativity low residual film stress when compared to conventional tungsten CVD processes. For example, in some embodiments, the tungsten gapfill CVD process includes heating the substrate to a temperature of about 250° C. or more, such as about 300° C. or more, or between about 250° C. and about 600° C., or between about 300° C. and about 500° C. During the CVD process, the processing volume 215 is typically maintained at a pressure of less than about 500 Torr, less than about 600 Torr, less than about 500 Torr, less than about 400 Torr, or between about 1 Torr and about 500 Torr, such as between about 1 Torr and about 450 Torr, or between about 1 Torr and about 400 Torr, or for example, between about 1 Torr and about 300 Torr.

In another embodiment, the tungsten gapfill material 608 is deposited at operation 508 using an atomic layer deposition (ALD) process. The tungsten gapfill ALD process includes repeating cycles of alternately exposing the substrate 600 to a tungsten-containing precursor gas and a reducing agent and purging the processing region 221 between the alternating exposures.

The tungsten-containing precursor and the reducing agent are each flowed into the processing region 221 for a duration of between about 0.1 seconds and about 10 seconds, such as between about 0.5 seconds and about 5 seconds. The processing region 221 is typically purged between the alternating exposures by flowing an inert purge gas, such as argon (Ar) or hydrogen, into the processing region 221 for a duration of between about 0.1 seconds and about 10 seconds, such as between about 0.5 seconds and about 5 seconds. The purge gas may be delivered from the deposition gas source 240 or from the bypass gas source 238.

In other embodiments, the tungsten gapfill material 608 is deposited using a pulsed CVD method that includes repeating cycles of alternately exposing the substrate 600 to a tungsten-containing precursor gas and a reducing agent without purging the processing region 221. The processing conditions for the tungsten gapfill pulsed CVD method may be the same, substantially the same, or within the same ranges as those described above for the tungsten gapfill ALD process.

It has been discovered that forming a nucleation layer 604 having high concentrations of boron relative to tungsten reduces film resistivity and reduces surface roughness of the tungsten-containing layer, while retaining seamless or substantially seamless gapfill at various thicknesses 620, such a thickness of about 2000 Å or less, such as about 600 Å or less film thickness, such as about 200 Å to about 600 Å. The film thickness 620 is measured as half a width of the tungsten-containing layer (e.g., nucleation layer 604 and tungsten gap fill material 608) disposed within the opening between opposing sidewall portions of the opening 605. Alternatively, the film thickness 620 is a distance between a centerline of the opening 605 and an interface of the adhesion layer 603 and nucleation layer 604. In some embodiments, the nucleation layer 604 and the fill layer 608 are monolithic and do not have an interface therebetween. The tungsten gapfill material 608 and the nucleation layer 604 together form a tungsten-containing layer having a resistivity of about 25 μΩ·cm or less depending on the thickness 620 of the tungsten-containing layer. The tungsten-containing layer 604, 608 includes a resistivity of about 20 μΩ·cm or less at a tungsten-containing layer thickness of about 200 Å or greater. In some embodiments, the tungsten-containing layer 604, 608 includes a resistivity of about 17.5 μΩ·cm or less at a tungsten-containing layer thickness of about 200 Å to about 600 Å. In some embodiments, the tungsten-containing layer 604, 608 includes a resistivity of about 15 μΩ·cm or less at a tungsten-containing layer thickness of about 450 Å or greater, such as about 450 Å to about 600 Å. In some embodiments, the tungsten-containing layer includes a surface roughness calculated by root mean square of about 3.5 nm or less, such as about 2 nm to about 3 nm.

Without being bound by theory, it is believed that the increased boron in the nucleation layer enables bulk tungsten grain growth in the thin film regime (e.g., thickness 620 of about 600 Å or less, such as about 200 Å to about 500 Å), reducing electron scattering at the tungsten grain boundary, and providing a resistivity reduction. During the treatment operation 506, a growth delay for the bulk tungsten enables reduced seam size in contact fill.

In operation 510, the substrate 600 is annealed. Annealing the substrate 600 further reduces the resistivity of the substrate. In some embodiments, the substrate 600 is annealed for about 1 second to about 10 minutes, such as about 5 seconds to about 120 seconds, such as about 10 seconds to about 100 seconds, such as about 30 seconds to about 60 seconds. In some embodiments, the substrate 600 is annealed at a temperature of about 600° C. or greater, such as about 700° C. to about 1200° C., such as about 800° C. to about 1000° C., such as about 850° C. to about 950° C. at a chamber pressure of about 30 Torr to about 70 Torr, such as about 50 Torr. In some embodiments, the substrate 600 is annealed in the presence of a gas including a nitrogen-containing gas, such as $N_2$ gas, an argon-containing gas, such as Ar gas, a hydrogen-containing gas, such as $H_2$ gas, or combinations thereof. In some embodiments, the gas is flowed a volumetric flow rate of about 5 L/min, such as 15 L/min, such as 10 L/min.

The annealed substrate includes the nucleation layer 604 that has been modified from annealing. The modified nucleation layer has an atomic ratio of boron to tungsten of about 1:n, where n is about 4 or less, such as about 1:3 to about 1:1, such as about 1:2 to about 1:1. In some embodiments, the modified nucleation layer includes about 10% or more atomic boron concentration relative to tungsten compared to the nucleation layer 604 prior to annealing, such as about 2 to 3 times the amount of boron relative to tungsten. By way of example, in one embodiment, a nucleation layer prior to annealing includes a ratio of atomic boron to tungsten of about 1:4 to 1:5, such as about 1:4.5 and after annealing, the modified nucleation layer includes a boron to tungsten ratio of about 1:1 to about 1:3, such as about 1:2.

The annealed substrate includes the tungsten-containing layer 604, 608 that has been modified from annealing. The modified tungsten-containing layer includes a resistivity of about 20 μΩ·cm or less depending on the thickness 620 of the modified tungsten-containing layer. The modified tungsten-containing layer includes a resistivity of about 17 μΩ·cm or less at a tungsten-containing layer thickness of about 200 Å or greater. In some embodiments, the modified tungsten-containing layer includes a resistivity of about 10 μΩ·cm to 16 μΩ·cm at a modified tungsten-containing layer thickness of about 200 Å to about 600 Å. In some embodiments, the modified tungsten-containing layer includes a resistivity of about 10 μΩ·cm to 14 μΩ·cm at a tungsten-containing layer thickness of about 450 Å or greater, such as about 450 Å to about 600 Å. In some embodiments, the tungsten-containing layer includes a surface roughness calculated by root mean square of about 3.5 nm or less, such as about 2 nm to about 3 nm. In some embodiments, the resistivity of the modified tungsten-containing layer is reduced by 10% or greater, such as about 20% to about 40% relative to the tungsten-containing layer prior to annealing.

Without being bound by theory, it is believed that annealing the substrate 600 increases grain size of the structure of the tungsten-containing layer contributing to a reduction of resistivity. In some embodiments, the grain size in the tungsten containing layer 604, 608 increased by about 5% or greater, such as about 10% to about 30%, such as about 15% to about 20% after annealing, as measured by X-ray diffraction (XRD) imaging. It was further observed that the modified tungsten-containing included alpha-phase tungsten and was substantially free of beta-phase tungsten. Alpha-phase tungsten is stable and has good electrical conductivity. It has also been discovered that the process described herein includes about 50 Å to about 300 Å incubation growth, such as about 70 Å to about 100 Å compared to conventional SSW of about 1150 Å to about 1250 Å.

In a typical semiconductor manufacturing scheme, a chemical mechanical polishing (CMP) process may be used to remove an overburden of tungsten material (and the barrier layer disposed there below) from the field surface of the substrate following depositing the tungsten gapfill material 608 into the opening 605.

Example

Figure 7:
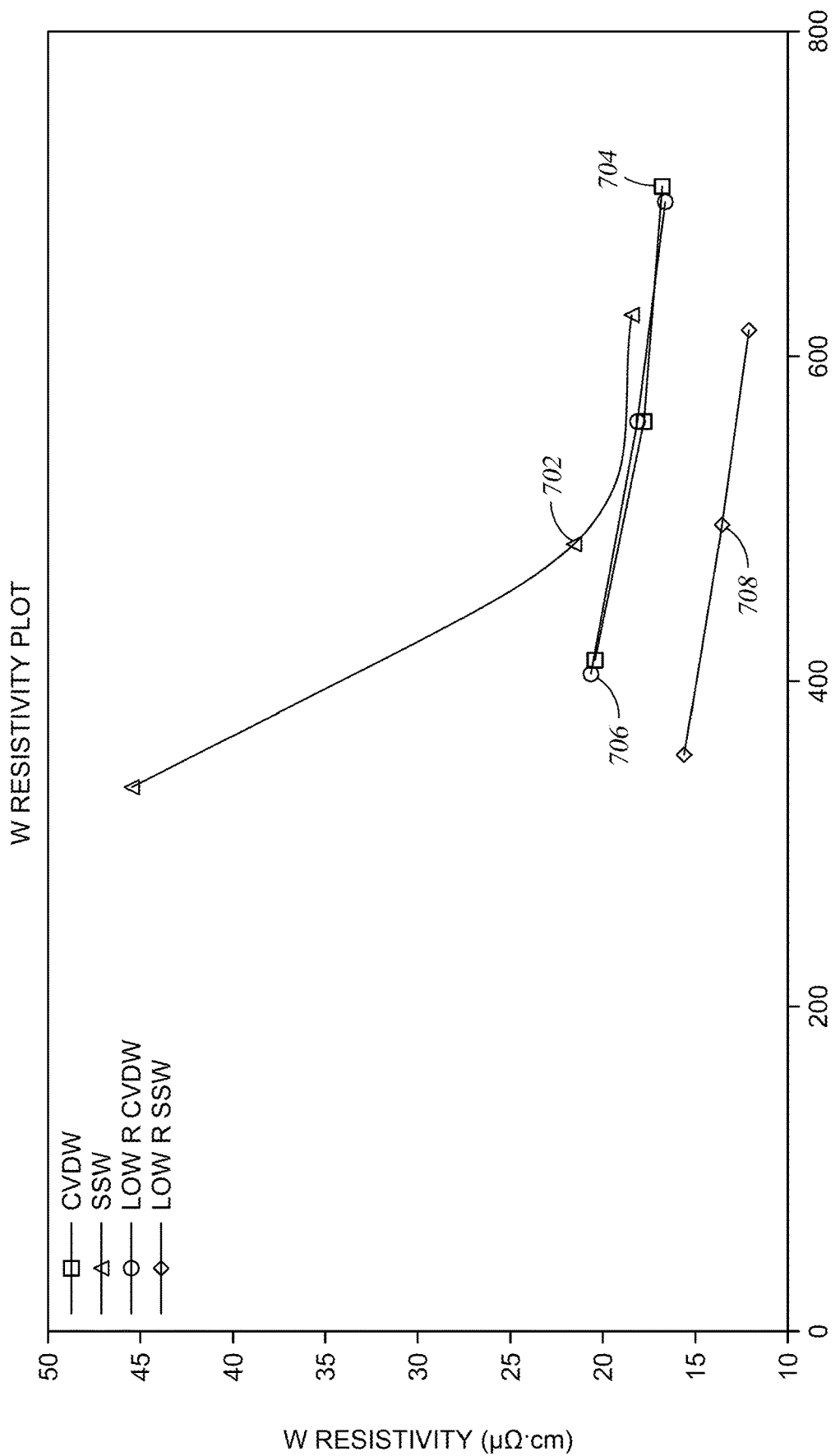
FIG. 7 depicts comparative curves illustrating resistivity of film layers formed using the methods set forth herein and comparative methods at various film thicknesses, according to some embodiments.

FIG. 7 depicts comparative curves illustrating resistivity of film layers formed using the methods set forth herein and comparative methods, according to some embodiments. The curves 702, 704, 706, 708 depict film resistivity results as a function of film thickness for each film sample. As used herein, film resistivity is measured using ASTM B193-20 (2020) using KLA Rs-200 resistivity mapping system to measure the sheet resistance with 4-point probe. The film thickness is measured with Rigaku MFM65 in-line XRF wafer inspection system. Sheet resistance is multiplied by the film thickness to obtain film resistivity.

Curve 702 corresponds to a film formed using a process similar to the process described herein prior to annealing and having a nucleation layer having a boron to tungsten atomic ratio of about 1:4.5 or less, such as about 1:4.6 to about 1:6. The sample film for curve 702 can be formed using operations 502 to 508 of method 500. The sample film for curve 702 was formed by exposing the sample to a nitrogen plasma from a remote plasma source, as described in operation 508. Curve 704 corresponds to a film deposited using a conventional CVD process. The conventional CVD process shown by curve 704 provided relatively low resistivity across all thickness regimes; however, the film included voids and seams within the openings and did not produce good structure properties. The film of curve 702 provided good gapfill properties that were substantially free of voids and seams; however, at film thicknesses below 500 Å, the resistivity increased at about 20 µΩ·cm and greater. Curve 706 corresponds to a film formed using a conventional CVD process with an increased concentration of boron in the nucleation layer, such as a nucleation layer having a boron to tungsten atomic ratio of about 1:4 or greater, such as about 1:3 to about 1:2. As can be seen, the resistivity after increasing boron concentration in the nucleation of a film formed using a conventional CVD process provides a reduction in film resistivity. The reduced film resistivity for thicknesses 200 Å to 600 Å does not achieve resistivity of about 16 µΩ·cm or lower.

Curve 708 corresponds to a film formed using the process described herein prior to annealing (e.g., method 500, operations 502 to 508) and having a nucleation layer having a boron to tungsten atomic ratio of about 1:4 or greater, such as about 1:3 to about 1:2. The film of curve 708 was similar to the film of curve 702 except the film of curve 708 included a higher boron concentration in the nucleation layer. The film of curve 708 provided good gapfill properties that were free, or substantially free of voids and seams, and also produced low resistivity results for thicknesses below 500 Å and for thickness above 500 Å. Relative to the film corresponding to curve 702, the film corresponding to curve 708 provided a 10-70% reduction in film resistivity for thicknesses of about 200 Å to about 2000 Å while also providing suppressed gapfill used in the treatment processes post nucleation layer. The reduction of film resistivity is greater in thin films relative to thick films. As compared with a sample formed by conventional CVD process, samples formed using operations 502 to 508 of the method 500 with higher boron concentration in the nucleation layer surprisingly provided reduced resistivity of much lower resistivity with much lower roughness.

Figure 8:
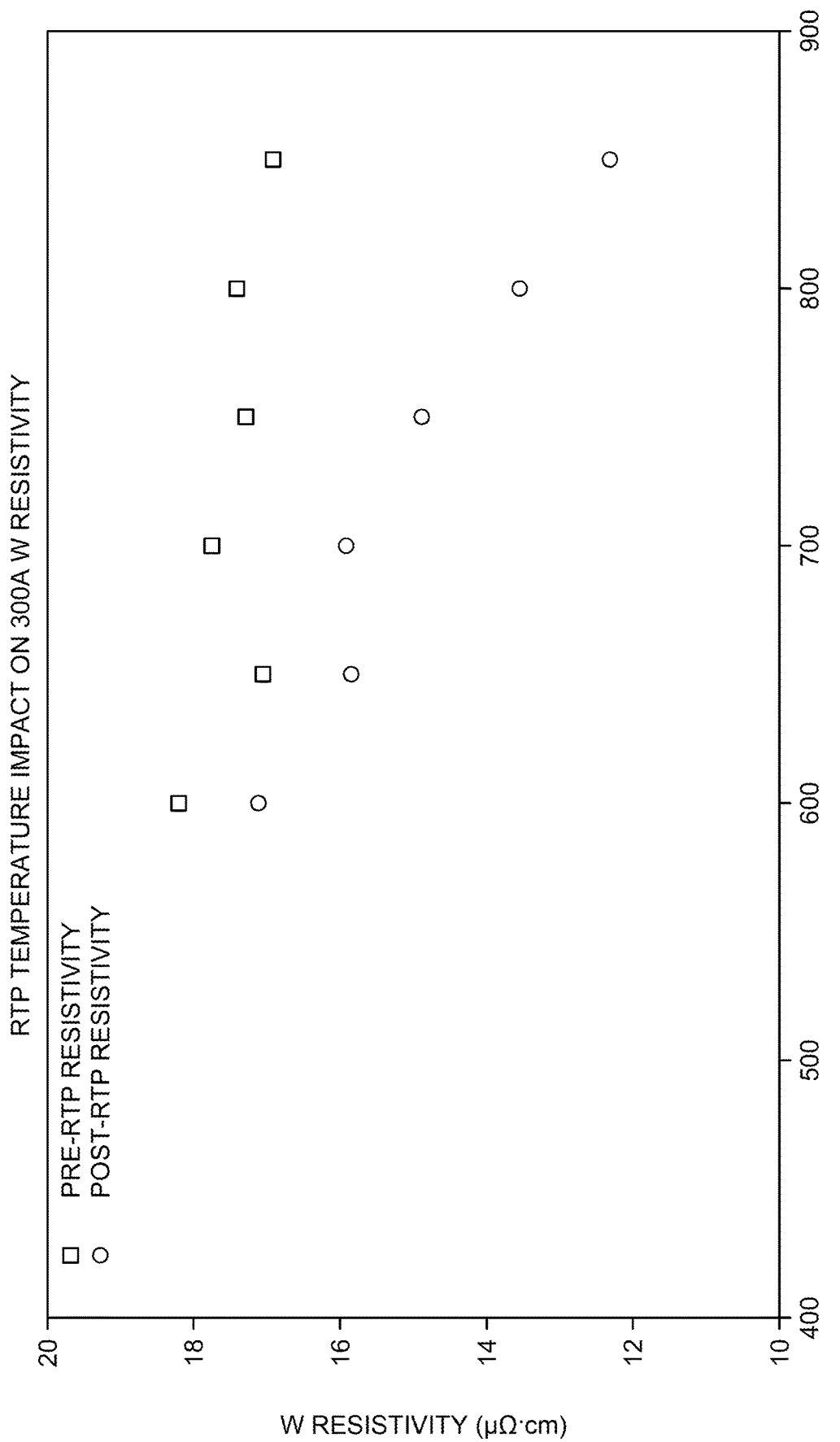
FIG. 8 depicts comparative curves illustrating resistivity of film layers formed using the methods set forth herein before and after annealing at various temperatures, according to some embodiments.

FIG. 8 depicts the impact of annealing temperature on samples having a tungsten-containing layer with a thickness of about 300 Å, the tungsten-containing layer on each sample can be formed using operations 502 to 508 of method 500 as controls and corresponding samples formed using operations 502 to 510 with annealing. Each pair of data points corresponds to a resistivity measurement at annealing temperatures ranging from 600° C. to 850° C. in 50 degree intervals compared with control samples that were not annealed. As can be seen, the higher annealing temperatures generally corresponded to much greater amount of resistivity reduction. In addition to resistivity improvement, films after annealing maintained low surface roughness. Without being bound by theory, and as observed by microscopy imaging, it is believed that the grain growth occurred in a planar manner with some increase in film thickness rather than rough vertical growth.

Figure 9:
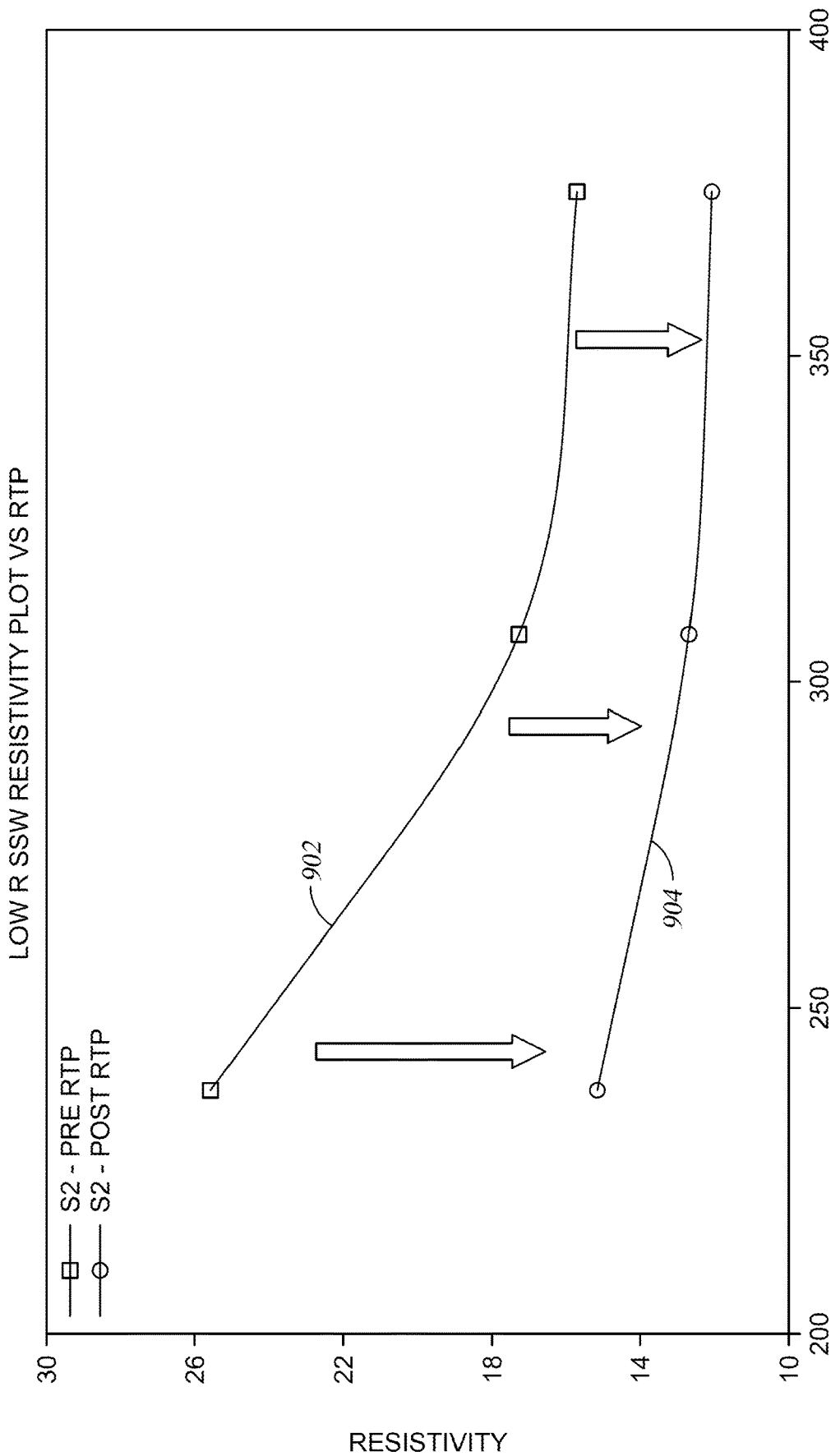
FIG. 9 depicts comparative curves illustrating resistivity of film layers formed using the methods set forth herein before and after annealing at various film thicknesses, according to some embodiments.

FIG. 9 depicts the impact of annealing on samples having a tungsten-containing layer with a varying thicknesses. The curve 902 includes resistivity measurements as a function of film thickness for samples formed using operations 502 to 508 of method 500 as controls and curve 904 includes resistivity measurements for corresponding samples formed using operations 502 to 510 with annealing. As can be seen, a greater impact of annealing is observed for thinner films such as below 300 Å.

Table 1 depicts a comparative of grain sizes before and after annealing. A first sample (s1) was formed using operations 502 to 508 of method 500. The thickness of s1 before annealing was 227.7 Å and had a resistivity of 45.6 µΩ·cm. The grain size was measured to be 225 Å. A second sample (s2) was formed in the same manner as the first sample s1 and was then annealed at 850° C. for 60 seconds. The film thickness of the sample expanded by less than 5% and the grain size expanded to 252 Å. The roughness remained substantially the same between the first and second samples. Without being bound by theory, and as evidenced by topology imaging, it is believed that the grain expansion occurred in a planar manner such that roughness remained substantially the same and film thickness expansion was minimized. As a result of the grain grown, the second sample s2 had a reduced resistivity relative to the first sample.

A third sample (s3) was formed using operations 502 to 508 of method 500. The thickness of s3 before annealing was 324.4 Å and had a resistivity of 16.3 µΩ·cm. The grain size was measured to be 265 Å. A fourth sample (s4) was formed in the same manner as the third sample s3 and was then annealed at 850° C. for 60 seconds. The film thickness of the sample expanded by less than 6% and the grain size expanded to 316 Å. The roughness remained substantially the same between the first and second samples. As a result of the grain grown, the fourth sample s4 had a reduced resistivity relative to the third sample. The reduction in resistivity was observed to be much greater for thinner films, as demonstrated by the second sample relative to the first sample

TABLE 1

Grain Size Comparative

|  | s1<br>Low R<br>SSW | s2<br>Low R SSW<br>w/RTP | s3<br>Low R<br>SSW | s4<br>Low R SSW<br>w/RTP |
| --- | --- | --- | --- | --- |
| grain size (Å) | 225 | 252 | 265 | 316 |
| Thickness (Å) | 227.7 | 237.9 | 324.4 | 342.9 |
| Resistivity (µΩ · cm) | 45.6 | 15.1 | 16.3 | 12.6 |

Additional Aspects

The present disclosure can include the following non-limiting aspects and/or embodiments:

Clause 1. A structure on a substrate comprising: an opening within the substrate; and a tungsten-containing layer comprising: nucleation layer disposed along sidewalls of the opening, wherein the nucleation layer comprises boron and tungsten; and a fill layer disposed over the nucleation layer within the opening, wherein the tungsten-containing layer comprises a resistivity of about 16 μΩ·cm or less, wherein the tungsten-containing layer has a thickness of about 200 Å to about 600 Å, wherein a thickness of the tungsten-containing layer is half a width of the tungsten-containing layer disposed within the opening between opposing sidewall portions of the opening.

Clause 2. The structure of Clause 1, wherein the nucleation layer comprises a boron to tungsten ratio of about 1:4 to about 1:1.

Clause 3. The structure of Clause 1 or Clause 2, wherein the boron to tungsten ratio is about 1:3 to 1:2.

Clause 4. The structure of any of Clauses 1 to 3, further comprising an adhesion layer disposed between the substrate and the nucleation layer.

Clause 5. The structure of any of Clauses 1 to 4, wherein the tungsten-containing layer further comprises nitrogen, oxygen, fluorine, or a combination thereof.

Clause 6. A structure on a substrate comprising: an opening within the substrate; an adhesion layer disposed on a sidewall of the opening; and a tungsten-containing layer disposed over the adhesion layer within the sidewall, the tungsten-containing layer having a resistivity of about 16 μΩ·cm or less, tungsten-containing layer having a thickness of about 200 Å to about 600 Å, wherein the tungsten-containing layer thickness is half a width of the tungsten-containing layer disposed within the opening between opposing sidewall portions of the opening.

Clause 7. The structure of Clause 6, wherein the thickness of the tungsten-containing layer is about 300 Å to about 600 Å, wherein the resistivity of the tungsten-containing layer is about 14 μΩ·cm or less.

Clause 8. The structure of Clause 6 or Clause 7, wherein the tungsten-containing layer comprises a nucleation layer comprising boron.

Clause 9. The structure of any of Clauses 6 to 8, wherein a boron to tungsten ratio is about 1:3 to 1:1.

Clause 10. The structure of any of Clauses 6 to 9, wherein the tungsten-containing layer comprises a surface roughness calculated by root mean square of about 3.5 nm or less.

Clause 11. The structure of any of Clauses 6 to 10, wherein the tungsten-containing layer comprises a surface roughness calculated by root mean square of about 2 nm to about 3 nm.

Clause 12. A method of forming a structure on a substrate, comprising: exposing the substrate to a tungsten-containing precursor gas at a precursor gas flow rate; exposing the substrate to a reducing agent comprising boron at a reducing agent flow rate, wherein the tungsten-containing precursor gas and the reducing agent are alternated cyclically to form a nucleation layer over the substrate within at least one opening of the substrate; depositing a fill layer over the nucleation layer within the at least one opening; and annealing the substrate at about 600° C. to about 1000° C.

Clause 13. The method of Clause 12, further comprising transferring the substrate to a rapid thermal processing chamber prior to annealing the substrate.

Clause 14. The method of Clause 12 or Clause 13, wherein annealing the substrate comprises exposing the substrate to a hydrogen gas.

Clause 15. The method of any of Clauses 12 to 14, wherein the reducing agent flow rate is about 300 sccm or greater.

Clause 16. The method of any of Clauses 12 to 15, wherein the precursor gas flow rate is about 60 sccm or less.

Clause 17. The method of any of Clauses 12 to 16, further comprising filling a reservoir with the reducing agent using reservoir valve disposed upstream of the reservoir, flowing the reducing agent from the reservoir to a process volume comprising the substrate by opening a mass flow control valve disposed between the process volume and the reservoir.

Clause 18. The method of any of Clauses 12 to 17, wherein filling the reservoir further comprises opening the reservoir valve when a pressure of the reservoir is below a predetermined pressure.

Clause 19. The method of any of Clauses 12 to 18, wherein the substrate is annealed for about 1 second to about 10 minutes.

Clause 20. The method of Clause 19, wherein the substrate is annealed for about 10 seconds to about 60 seconds.

Clause 21. The method of any of Clauses 12 to 20, wherein annealing substrate comprises flowing a gas selected from the group consisting of nitrogen-containing gas, an argon-containing gas, a hydrogen-containing gas, or combinations thereof over the substrate.

Clause 22. The method of any of Clauses 12 to 21, wherein the substrate is annealed from a plurality of heat lamps disposed above the substrate.

Clause 23. The method of any of Clauses 12 to 22, wherein the substrate is annealed at a temperature of about 700° C. to about 900° C.

Clause 24. The method of any of Clauses 12 to 23, wherein the reducing agent gas flow rate to precursor agent flow rate ratio is m:1, where m is about 5 or greater, by volume.

Clause 25. A method of forming a structure on a substrate, comprising: exposing the substrate to a tungsten-containing precursor gas at a precursor gas flow rate; exposing the substrate to a reducing agent comprising boron at a reducing agent flow rate, wherein the tungsten-containing precursor gas and the reducing agent are alternated cyclically to form a nucleation layer over the substrate within at least one opening of the substrate; depositing a fill layer over the nucleation layer within the at least one opening, wherein the fill layer and nucleation layer together form a tungsten-containing layer comprising a first resistivity; and annealing the tungsten-containing layer at about 600° C. to about 1000° C. to form a modified tungsten-containing layer having a second resistivity lower than the first resistivity.

Clause 26. The method of Clause 25, wherein the second resistivity is about 10% to 50% lower than the first resistivity.

While the foregoing is directed to embodiments of the present disclosure, other and further embodiments of the disclosure may be devised without departing from the basic scope thereof, and the scope thereof is determined by the claims that follow.

What is claimed is:

1. A method of forming a structure on a substrate, comprising:
exposing the substrate to a tungsten-containing precursor gas at a precursor gas flow rate;
exposing the substrate to a reducing agent comprising boron at a reducing agent flow rate, wherein the tungsten-containing precursor gas and the reducing agent are alternated cyclically to form a nucleation layer over the substrate within at least one opening of the substrate, the nucleation layer comprising a boron to tungsten atomic ratio of about 1:4.5 to about 1:1;

treating the nucleation layer with an activated nitrogen species;

depositing a fill layer over the treated nucleation layer within the at least one opening; and annealing the substrate at about 600° C. or greater.

2. The method of claim 1, wherein the substrate is annealed for about 1 second to about 10 minutes.

3. The method of claim 1, wherein the fill layer and the treated nucleation layer together have a resistivity of 25 μΩ·cm or less.

4. The method of claim 3, wherein the fill layer and the treated nucleation layer together have a resistivity of about 17 μΩ·cm or less and a thickness of about 200 angstroms to about 600 angstroms.

5. The method of claim 1, wherein the annealing the substrate creates a boron to tungsten atomic ratio of about 1:1 to about 1:3.

6. The method of claim 1, wherein the annealing the substrate creates a resistivity of about 10 μΩ·cm to about 16 μΩ·cm and a thickness of about 200 angstroms to about 600 angstroms.

7. The method of claim 1, wherein the annealing the substrate increases a grain size of the fill layer and the treated nucleation layer together by about 5% or greater.

8. The method of claim 7, wherein the annealing the substrate increases a grain size of the fill layer and the treated nucleation layer together by about 10% to about 30%.

9. The method of claim 7, wherein the annealing the substrate increases an incubation growth of the grain size of about 50 angstroms to about 300 angstroms.

10. The method of claim 1, wherein the fill layer has a root mean square surface roughness of about 3.5 nm or less.

11. A method of forming a structure on a substrate, comprising:

exposing an adhesion layer formed on the substrate to a tungsten-containing precursor gas at a precursor gas flow rate;

exposing the substrate to a reducing agent comprising boron at a reducing agent flow rate, wherein the tungsten-containing precursor gas and the reducing agent are alternated cyclically to form a nucleation layer over the adhesion layer within at least one opening of the substrate, the nucleation layer comprising a boron to tungsten atomic ratio of about 1.1:1 to about 2:1;

treating the nucleation layer with an activated nitrogen species;

depositing a fill layer to a thickness that is half of a width of the at least one opening; and annealing the substrate at about 600° C. to about 1000° C.

12. The method of claim 11, wherein the fill layer thickness is between about 200 angstroms and about 600 angstroms within the at least one opening.

13. The method of claim 11, wherein annealing the substrate comprises exposing the substrate to a hydrogen gas.

14. The method of claim 11, further comprising filling a reservoir with the reducing agent using reservoir valve disposed upstream of the reservoir, flowing the reducing agent from the reservoir to a process volume comprising the substrate by opening a mass flow control valve disposed between the process volume and the reservoir.

15. The method of claim 14, wherein the reducing agent flow rate is about 300 sccm or greater.

16. The method of claim 14, wherein filling the reservoir further comprises opening the reservoir valve when a pressure of the reservoir is below a predetermined pressure.

17. The method of claim 11, wherein the substrate is annealed for about 1 second to about 10 minutes.

18. The method of claim 11, wherein the adhesion layer contains titanium nitride.

19. The method of claim 18, wherein adhesion layer thickness is about 20 angstroms and about 150 angstroms.

20. A method of forming a structure on a substrate, comprising:

(a) exposing an adhesion layer formed on the substrate to a tungsten-containing precursor gas for a first period of time;

(b) exposing the substrate to a reducing agent comprising boron for a second period of time;

(c) cyclically alternating (a) and (b) at least one time to form a nucleation layer over the adhesion layer comprising a boron to tungsten atomic ratio of about 1:4.5 to about 1:1;

(d) treating the nucleation layer with an activated nitrogen species;

(e) depositing a fill layer over the nucleation layer, wherein the fill layer comprises a tungsten containing layer; and (f) annealing the substrate at about 600° C. to about 1000° C. for a third period of time, wherein the tungsten containing layer has a resistivity of about 16 μΩ-cm or less after annealing the substrate.

* * * * *